US009644802B2

(12) United States Patent
Takei et al.

(10) Patent No.: US 9,644,802 B2
(45) Date of Patent: May 9, 2017

(54) LIGHTING EQUIPMENT, LIGHTING DEVICE, AND LIGHT-EMITTING MODULE

(71) Applicant: Panasonic Intellectual Property Management Co., Ltd., Osaka (JP)

(72) Inventors: Naoko Takei, Osaka (JP); Kohji Hiramatsu, Osaka (JP); Tomoya Iwahashi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 276 days.

(21) Appl. No.: 14/434,968

(22) PCT Filed: Oct. 4, 2013

(86) PCT No.: PCT/JP2013/005932
§ 371 (c)(1),
(2) Date: Apr. 10, 2015

(87) PCT Pub. No.: WO2014/057639
PCT Pub. Date: Apr. 17, 2014

(65) Prior Publication Data
US 2015/0276150 A1 Oct. 1, 2015

(30) Foreign Application Priority Data
Oct. 12, 2012 (JP) .................. 2012-227042

(51) Int. Cl.
*F21K 9/64* (2016.01)
*F21K 99/00* (2016.01)
(Continued)

(52) U.S. Cl.
CPC ............... *F21K 9/56* (2013.01); *F21K 9/64* (2016.08); *F21V 23/003* (2013.01);
(Continued)

(58) Field of Classification Search
CPC . F21K 9/64; F21K 2/00; F21V 23/003; F21V 23/004; F21V 3/0463;
(Continued)

(56) References Cited

U.S. PATENT DOCUMENTS 5,770,917 A 6/1998 Yano et al.
2012/0008318 A1 1/2012 Ishiwata et al.

FOREIGN PATENT DOCUMENTS

JP    3040719 B2    5/2000
JP    2007-027310 A    2/2007
(Continued)

OTHER PUBLICATIONS

New Handbook for Color Science [3rd Edition] (Color Science Association of Japan), with partial English translation, 5 pages.
International Search Report issued in PCT/JP2013/005932, dated Jan. 14, 2014, with English translation.

*Primary Examiner* — Hargobind S Sawhney
(74) *Attorney, Agent, or Firm* — McDermott Will & Emery LLP

(57) ABSTRACT

Lighting equipment is provided that enables illumination light having a stable FCI to be obtained, without influence from the lighting conditions. To this end, lighting equipment 1 performs control of lighting a first light-emitting element 12a while substantially not lighting a second light-emitting element 12b when a red light-emitting element 12c is lit under first lighting conditions where a peak wavelength of light from the red light-emitting element 12c has a first value, and of lighting the second light-emitting element 12b while substantially not lighting the first light-emitting element 12a when the red light-emitting element 12c is lit under second lighting conditions where the peak wavelength of the light from the red light-emitting element 12c has a second value, the second value being greater than the first value.

10 Claims, 16 Drawing Sheets

(51) Int. Cl.

| | |
|---|---|
| *H01L 25/075* | (2006.01) |
| *H05B 33/08* | (2006.01) |
| *F21V 23/00* | (2015.01) |
| H01L 33/50 | (2010.01) |
| F21Y 115/10 | (2016.01) |
| F21Y 113/13 | (2016.01) |

(52) U.S. Cl.
CPC ........ *F21V 23/009* (2013.01); *H01L 25/0753* (2013.01); *H05B 33/0803* (2013.01); *H05B 33/0851* (2013.01); *F21Y 2113/13* (2016.08); *F21Y 2115/10* (2016.08); *H01L 33/504* (2013.01); *H01L 2924/0002* (2013.01)

(58) Field of Classification Search
CPC ............. F21V 3/0481; F21Y 2113/002; F21Y 2115/10; H01L 33/50; H01L 33/504; H05B 33/08

See application file for complete search history.

(56) References Cited

FOREIGN PATENT DOCUMENTS

| JP | 2009-048989 A | 3/2009 |
|---|---|---|
| JP | 2011-192738 A | 9/2011 |
| JP | 2011-199054 A | 10/2011 |
| JP | 2011-204659 A | 10/2011 |
| JP | 2012-064888 A | 3/2012 |

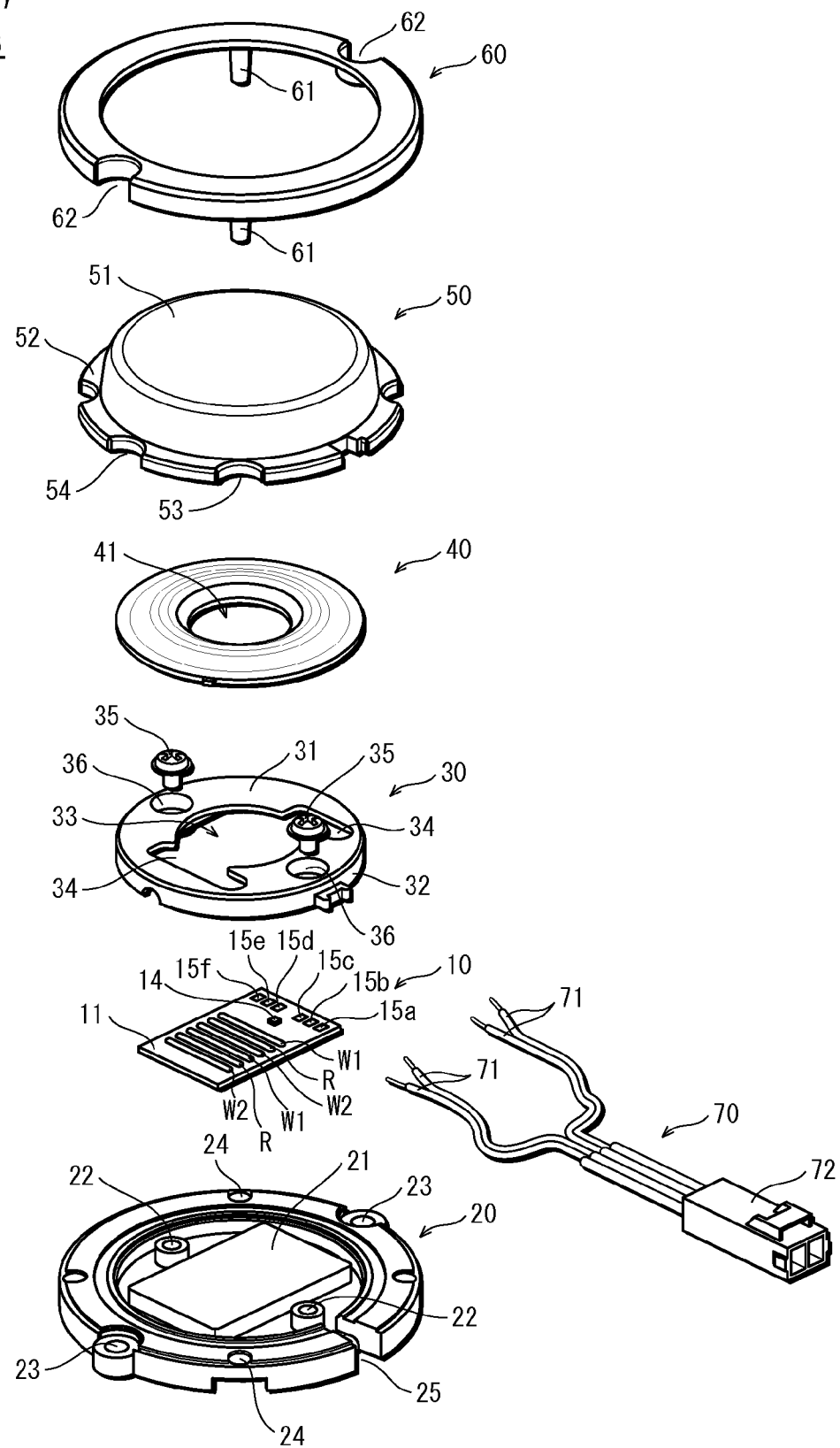

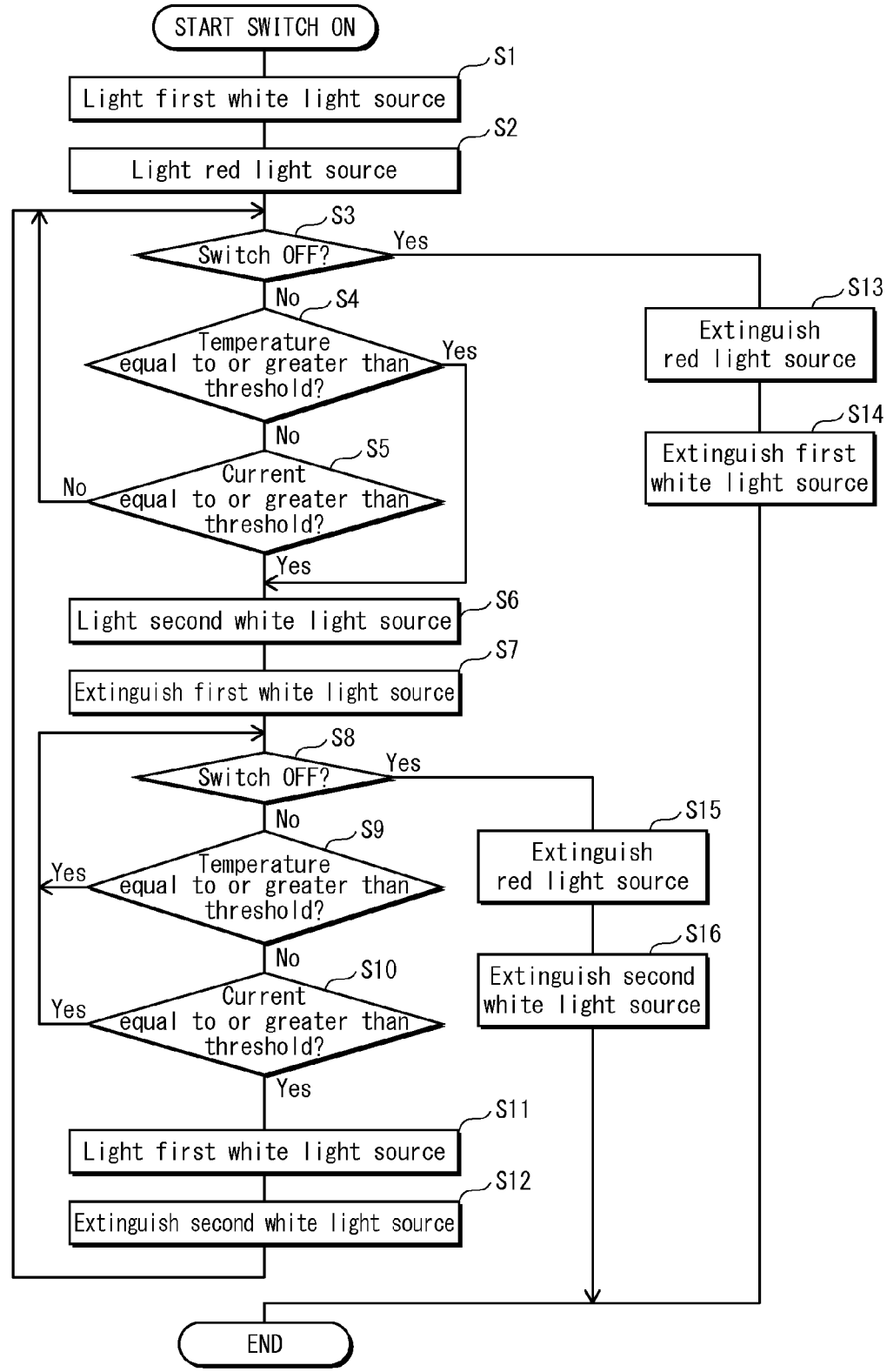

FIG. 13A
FIG. 13B
FIG. 13C
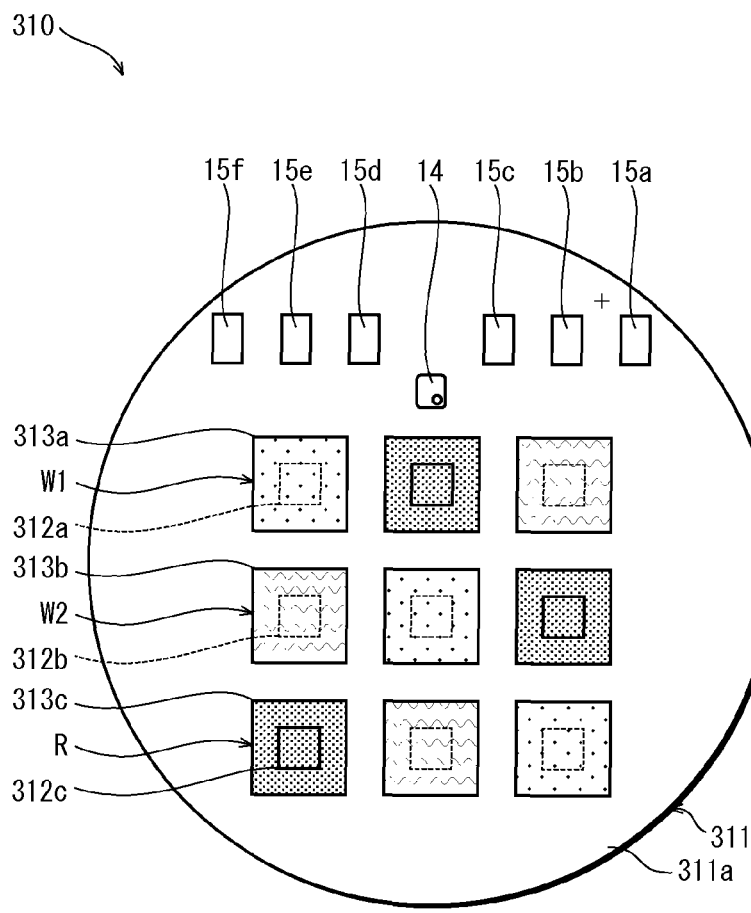
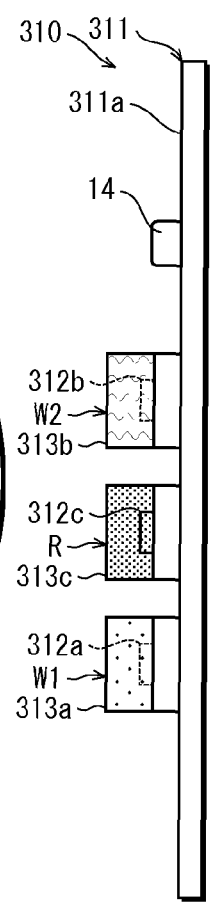
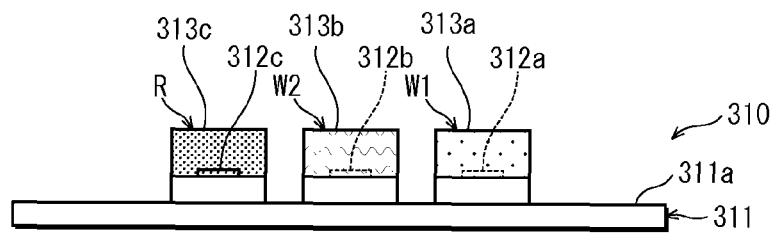

LIGHTING EQUIPMENT, LIGHTING DEVICE, AND LIGHT-EMITTING MODULE

RELATED APPLICATIONS

This application is the U.S. National Phase under 35 U.S.C. §371 of International Application No. PCT/JP2013/005932, filed on Oct. 4, 2013, which in turn claims the benefit of Japanese Application No. 2012-227042, filed on Oct. 12, 2012, the disclosures of which Applications are incorporated by reference herein.

TECHNICAL FIELD

The present disclosure pertains to lighting equipment, a lighting device, and a light-emitting module using a light-emitting element such as a light-emitting diode (hereinafter, LED), and particularly pertains to technology improving light characteristics in illumination light from such lighting equipment.

BACKGROUND ART

Conventionally, white light sources have been realized that generate white light by converting a portion of blue light emitted by a blue LED into yellow light, using a wavelength converter, and mixing the blue light with the yellow light. Various types of lighting equipment utilizing such a white light source have been commercialized.

However, lighting equipment using the above-described white light source is likely to produce illumination light not achieving desirable appearance of objects. This occurs because the illumination light of the white light source does not contain a sufficient red light component, which leads to the appearance of objects not being desirable.

Thus, proposals have been made for improving illumination light in terms of how objects appear therein by adding a red light source of red light to the white light source of white light, thereby supplementing the red light component (see Patent Literature 1).

CITATION LIST

Patent Literature

[Patent Literature 1]
Japanese Unexamined Patent Application Publication No. 2012-64888

Non-Patent Literature

[Non-Patent Literature 1]
New Edition Handbook of Color Science (3rd Edition), The Color Science Association of Japan

SUMMARY OF INVENTION

Technical Problem

However, upon actually manufacturing and lighting equipment that combines a white light source and a red light source, a phenomenon has been observed where the appearance of objects in illumination light changes in response to lighting conditions when a red LED is used as the red light source. That is, simply combining the white light source and the red light source poses difficulties in terms of maintaining desirable appearance of objects under various lighting conditions.

In consideration of the above problem, the present disclosure aims to provide lighting equipment that is able to produce illumination light achieving desirable appearance of objects, unaffected by the lighting conditions.

Solution to Problem

In order to achieve this aim, lighting equipment pertaining to an aspect of the disclosure comprises a first white light source including a first light-emitting element and a first wavelength converter member performing wavelength conversion on a portion of light from the first light-emitting element, the first white light source producing first white light by combining light from the first light-emitting element that is converted by the first wavelength converter member and light from the first light-emitting element that is not converted by the first wavelength converter member, a second white light source including a second light-emitting element and a second wavelength converter member performing wavelength conversion on a portion of light from the second light-emitting element, the second white light source producing second white light by combining light from the second light-emitting element that is converted by the second wavelength converter member and light from the second light-emitting element that is not converted by the second wavelength converter member, the light from the second light-emitting element that is converted by the second wavelength converter member differing spectrally from the light from the first light-emitting element that is converted by the first wavelength converter member in terms of at least one of peak wavelength and full width at half maximum, a red light source including a red light-emitting element and producing red light, and a control circuit performing control of lighting the first light-emitting element while substantially not lighting the second light-emitting element when the red light-emitting element is lit under first lighting conditions where a peak wavelength of light from the red light-emitting element has a first value, and of lighting the second light-emitting element while substantially not lighting the first light-emitting element when the red light-emitting element is lit under second lighting conditions where the peak wavelength of the light from the red light-emitting element has a second value, the second value being greater than the first value.

In the present disclosure, the terms white, red, blue, yellow, and so on are used to specify light colors. These terms are not intended to strictly conform to the definitions of the Comission Internationale de l'Eclairage (hereinafter, CIE) (e.g., CIE definitions of red as a wavelength of 700 nm, blue as a wavelength of 435.8 nm, and yellow as a wavelength 546.1 nm) and merely specify a wavelength region and range for the light. Accordingly, the wavelength is specified by using a numerical range wherever necessary to strictly specify the wavelength region of the light.

Advantageous Effects of Invention

The lighting equipment pertaining to an aspect of the present disclosure performs control such that a first light-emitting element is lit and a second light-emitting element is substantially not lit when a red light-emitting element is lit under first lighting conditions in which a peak wavelength of the light from the red light-emitting element has a first value. Conversely, the lighting equipment performs control such that the second light-emitting element is lit and the first light-emitting element is substantially not lit when the red light-emitting element is lit under second lighting conditions in which the peak wavelength of the light from the red light-emitting element has a second value that is greater than the first value. Accordingly, the combination of the first white light source and the red light source and the combination of the second white light source and the red light source are optimized to produce illumination light achieving desirable appearance of objects under the first lighting conditions and the second lighting conditions. As such, the appearance of objects in illumination light is maintained in desirable state without influence from the lighting conditions.

BRIEF DESCRIPTION OF DRAWINGS

FIG. 7 is an exploded perspective view diagram depicting the lighting device pertaining to the aspect of the present disclosure.

FIG. 10 is a flowchart describing white light source switching control operations pertaining to the aspect of the present disclosure.

FIGS. 13A, 13B, and 13C depict a light-emitting module pertaining to Variation 3, FIG. 13A being a plan view, FIG. 13B being a right-side view, and FIG. 13C being a front view.

DESCRIPTION OF EMBODIMENTS

Background Leading to Invention

The Feeling of Contrast Index (hereinafter, FCI) (see Non-Patent Literature 1) is an index for evaluating how objects appear in illumination light from lighting equipment. A high FCI evaluation is given to illumination light that causes an illumination target to be perceived with bright colors in a color rendering space.

However, obtaining illumination light with a high FCI is not easy. Specifically, illumination light from lighting equipment using a white light source that obtains white light by combining blue light and yellow light tends to have a low FCI. This is caused by the insufficient red components in the illumination light of the white light source. Insufficient red components result in a low FCI.

The inventors realized, upon actually manufacturing and lighting equipment combining a white light source and a red light source, that the FCI of illumination light changes in response to lighting conditions. For example, the FCI greatly differs between times when the temperature of the light-emitting element is low, such as at initial lighting time, and times when the temperature of the light-emitting element is high, such as after a period of time has passed since lighting. The FCI was also observed to change when the current flowing through the light-emitting element for dimming was changed (i.e., a change of brightness). In consideration of these observations, there is a possibility that despite optimizing the combination of the white light source and the red light source to obtain a desired FCI under given lighting conditions, the FCI may decrease when the lighting conditions change. Thus, the inventors arrived at developing lighting equipment that enables illumination light having a stable FCI to be obtained, without influence from the lighting conditions.

The inventors then discovered, as a result of various experiments described below, that the cause of the change in FCI is a shift in peak wavelength of the red light. Furthermore, the shift in peak wavelength of the red light was identified as being produced by a change in temperature of the red light-emitting element and by a change in current flowing through the red light-emitting element.

Figure 1:
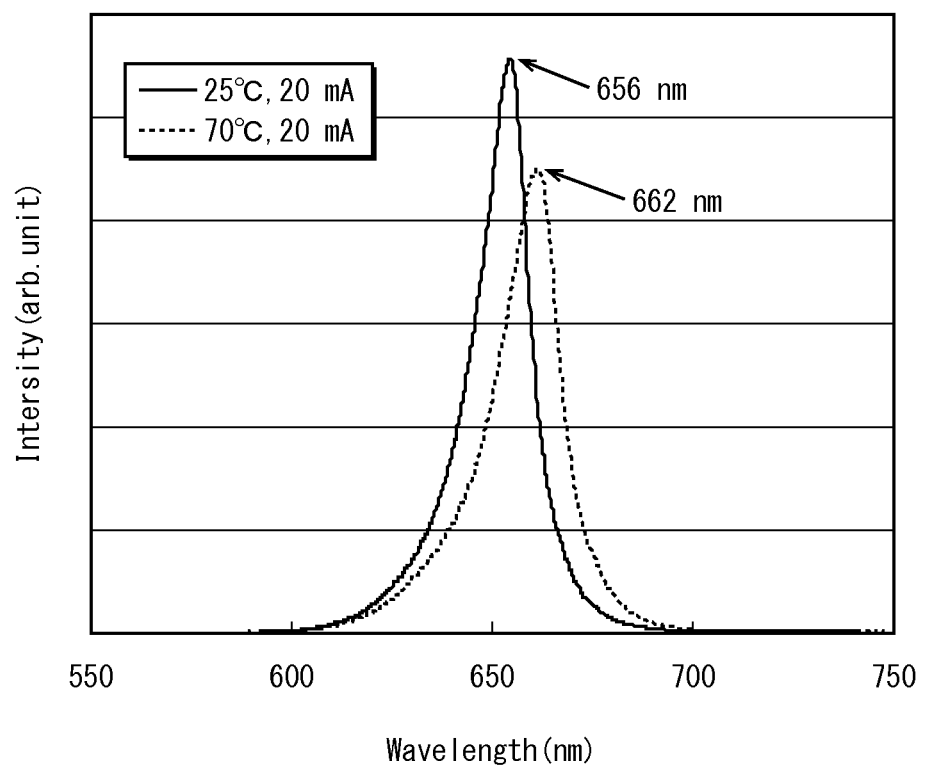
FIG. 1 describes a shift in the peak wavelength of red light toward longer wavelengths as temperature increases.

In a first experiment, the emission spectrum of the red light was measured with the red light-emitting element at a temperature of 25° C. and at a temperature of 70° C. while the current flowing through the red light-emitting element was held constant at 20 mA. FIG. 1 describes the shift in peak wavelength of the red light toward longer wavelengths as the temperature increases. As a result, and as depicted in FIG. 1, the peak wavelength is 656 nm when the temperature is 25° C., and is 662 nm when the temperature is 70° C. That is, a temperature increase of 45° C. produced a shift in the peak wavelength of 6 nm toward longer wavelengths. These results indicated that increasing the temperature of the red light-emitting element shifts the optical peak of the red light toward longer wavelengths.

Figure 2:
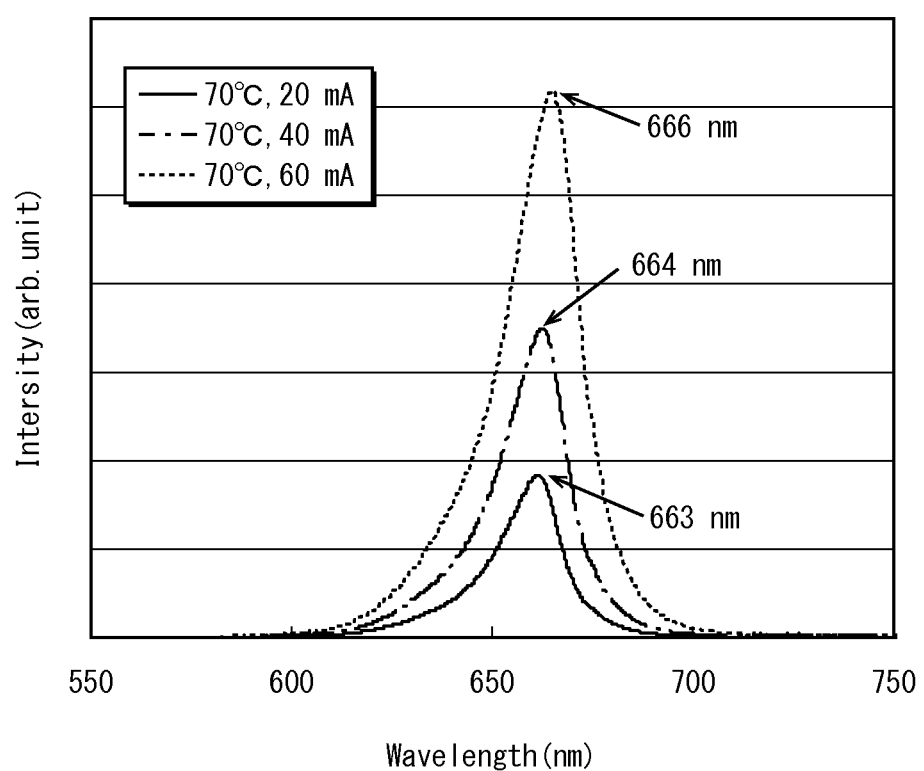
FIG. 2 describes the shift in the peak wavelength of the red light toward longer wavelengths as current increases.

In a second experiment, the emission spectrum of the red light was measured with the current flowing in the red light-emitting element at 20 mA, 40 mA, and 60 mA, while the temperature of the red light-emitting element was held constant at 70° C. FIG. 2 describes the shift in peak wavelength of the red light toward longer wavelengths as the current increases. As a result, as depicted in FIG. 2, the peak wavelength is 663 nm when the current is 20 mA, 664 nm when the current is 40 mA, and 666 nm when the current is 60 mA. That is, increasing the current by 40 mA produced a shift in the peak wavelength of 3 nm toward longer wavelengths. These results indicated that increasing the current flowing in the red light-emitting element also shifts the optical peak of the red light toward longer wavelengths.

Figure 3:
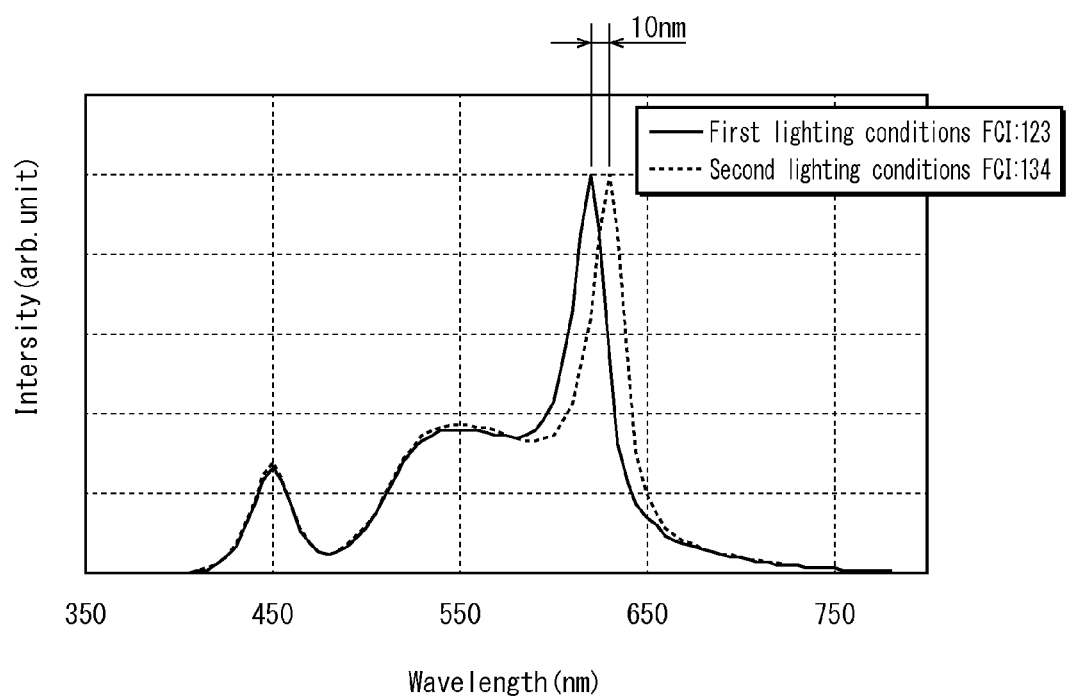
FIG. 3 describes the relationship between the peak wavelength of the red light and FCI.

In a third experiment, a conventional lighting equipment combining a white light source and a red light source was manufactured. This lighting equipment was lit under first lighting conditions and under second lighting conditions shifting the peak wavelength of the red light toward longer wavelengths relative to the first lighting conditions. The emission spectrum was measured for the illumination light under these respective conditions. Under the second lighting conditions, the temperature of the red light-emitting element is 45° C. higher and the current flowing in the red light-emitting element is 60 mA higher than under than first lighting conditions. FIG. 3 describes the relationship between the peak wavelength of the red light and the FCI. As a result, as depicted in FIG. 3, changing from the first lighting conditions to the second lighting conditions shifts the peak wavelength of the red light by 10 nm toward longer wavelengths and changes the FCI from 123 to 134. These results indicated that shifting the peak wavelength of the red light by changing the lighting conditions also changed the FCI.

In these experiments, the lighting conditions were changed by increasing the temperature of the red light-emitting element and increasing the current flowing in the red temperature. However, the results of the first experiment suggest that increasing the temperature of the red light-emitting element while the current flowing in the red light-emitting element is held constant, for example, would also change the FCI. Likewise, the results of the second experiment suggest that increasing the current flowing in the red light-emitting element while the temperature of the red light-emitting element is held constant would also change the FCI.

To summarize the above experiment results, the FCI changes because the peak wavelength of the red light shifts toward longer wavelengths. The shift in peak wavelength is caused by an increase in the temperature of the red light-emitting element and by an increase in the current flowing through the red light-emitting element. Then, in a conventional lighting equipment, given that the combination of the white light source and the red light source had been optimized under an assumption of lighting conditions in which the peak wavelength is not shifted toward the longer wavelengths, the shift in the peak wavelength toward the longer wavelengths produced a mismatch that lowered the FCI.

Given the above background, the inventors arrived at uniting a first white light source producing first white light combining beneficially with the red light before shifting and a second white light source producing second white light combining beneficially with the red light after shifting, in order to obtain a desired FCI after the shift in peak wavelength. Furthermore, knowledge was obtained to the effect that, in order to maintain a stable FCI, the red light before shifting is beneficially combined with white light having a stronger green component, while the red light after shifting is beneficially combined with white light having a stronger yellow component. Then, switching between the two white light sources in accordance with shift conditions of the red light peak wavelength successfully realized lighting equipment obtaining illumination light having a desired FCI both before shifting and after shifting.

Figure 4A:
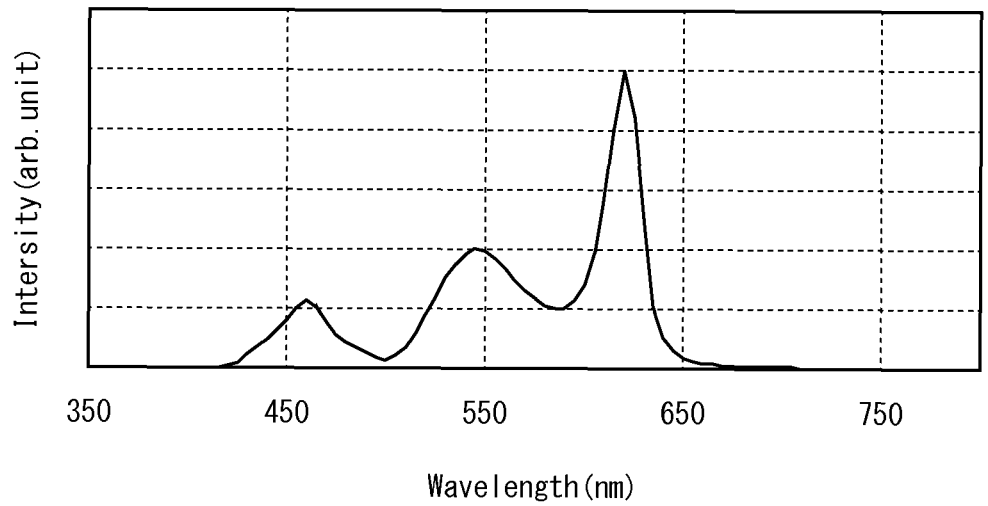
FIGS. 4A and 4B describe obtaining a stable FCI that is not affected by the lighting conditions.
Figure 4B:
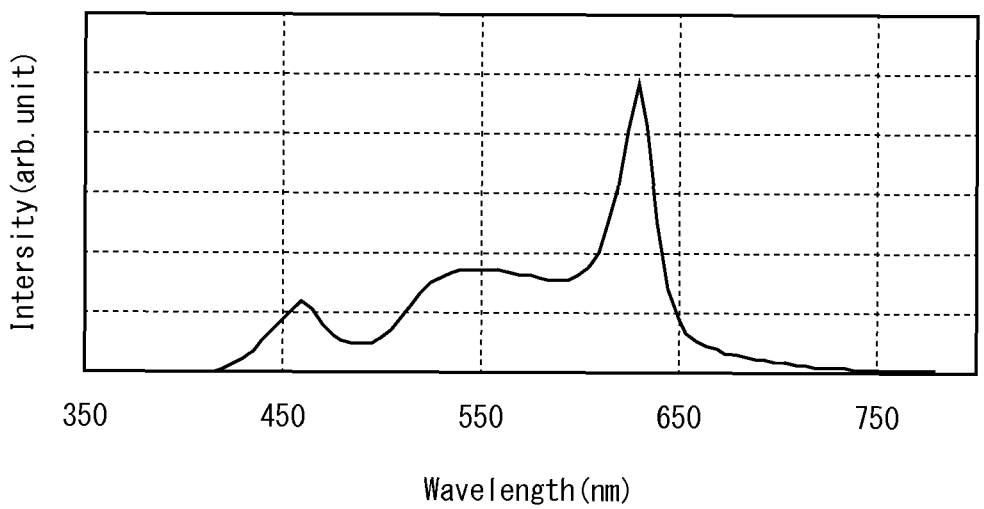

In a fourth experiment, lighting equipment pertaining to the present disclosure, equipped with a red light source, a first white light source, and a white light source, was manufactured. The emission spectrum of the illumination light under the first lighting conditions, in which the red light is not shifted, and under the second lighting conditions, in which the red light is shifted. FIGS. 4A and 4B describe the stable FCI obtained without influence from the lighting conditions. FIG. 4A indicates the emission spectrum and FCI of the illumination light under the first lighting conditions, and FIG. 4B indicates the emission spectrum and FCI of the illumination light under the second lighting conditions.

Comparing the emission spectrum depicted in FIG. 4A and the emission spectrum depicted in FIG. 4B reveals that the peak wavelength is shifted more toward the longer wavelengths under the second lighting conditions than under the first lighting conditions. However, switching the white light source increases the yellow component of the white light under the second lighting conditions relative to the first lighting conditions. As such, the difference in FCI between the first and second lighting conditions remains small. As such, the illumination light of the lighting equipment pertaining to the disclosure was confirmed to have a stable FCI not influenced by the lighting conditions.

<Lighting Equipment>

Lighting equipment, lighting device, and light-emitting module pertaining to an aspect of the present disclosure are described below, with reference to the accompanying drawings. The components given in the drawings are reduced in size and differ from reality.

Figure 5:
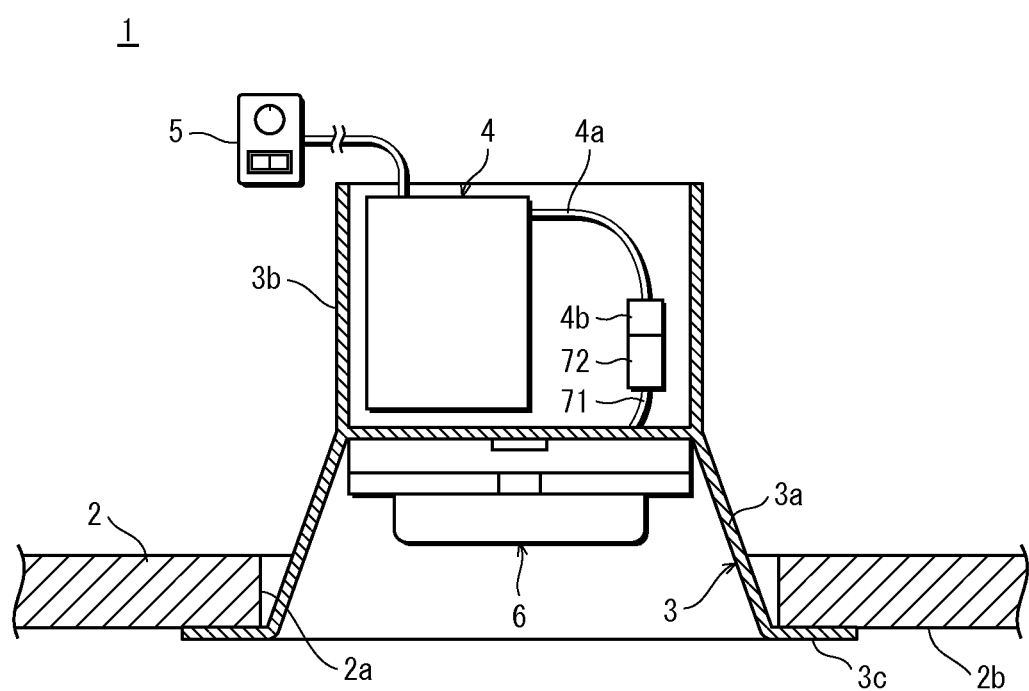
FIG. 5 is a cross-sectional diagram depicting lighting equipment pertaining to an aspect of the present disclosure.

FIG. 5 is a cross-sectional diagram depicting lighting equipment pertaining to an aspect of the present disclosure. As depicted in FIG. 5, lighting equipment 1 pertaining to the aspect of the present disclosure is, for example, a downlight affixed by mounting in a ceiling 2, and includes a fixture 3, a circuit unit 4, a dimming unit 5, and a lighting device 6.

The fixture 3 is, for example, made of metal, and includes a lamp housing 3a, a circuit housing 3b, and an outer flange 3c. The lamp housing 3a is, for example, a bottomed cylinder. The lighting device 6 is removably attached within the lamp housing 3a. The circuit housing 3b, for example, extends toward a bottom side of the lamp housing 3a, and houses the circuit unit 4 therein. The outer flange 3c is, for example, annular, and extends outward from an opening in the lamp housing 3a. The fixture 3 is affixed to the ceiling 2 by, for example, a (non-diagrammed) mounting screw filling a filling hole 2a where the lamp housing 3a and the circuit housing 3b pass through the ceiling 2 with the outer flange 3c being in contact with a periphery of the filling hole 2a at a lower face 2b of the ceiling 2.

The circuit unit 4 serves to light the lighting device 6, and includes a power supply line 4a that is electrically connected to the lighting device 6. A connector 4b, affixed to a front end of the power supply line 4a, is removably connected to lead lines 71 and a connector 72 of the lighting device 6.

The dimming unit 5 is used by a user to adjust the brightness of the illumination light from the lighting device 6. The dimming unit 5 is electrically connected to the circuit unit 4, and outputs a dimming signal to the circuit unit 4 upon receiving a user operation.

<Lighting Apparatus>

Figure 6:
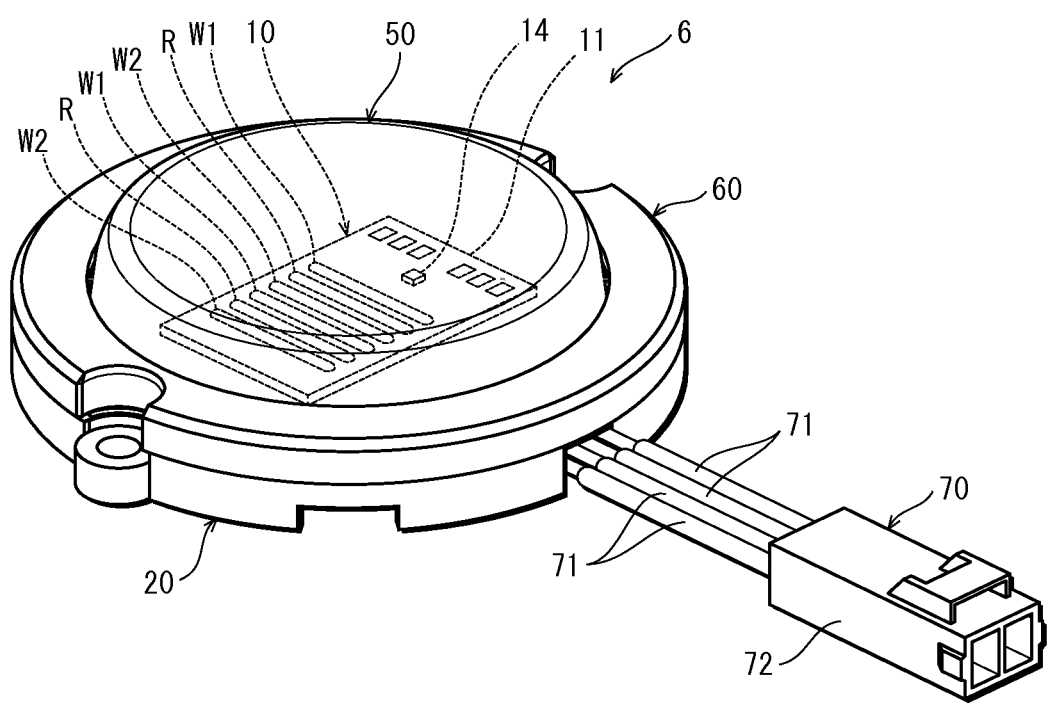
FIG. 6 is a perspective view diagram depicting the lighting device pertaining to the aspect of the present disclosure.

FIG. 6 is a perspective view diagram depicting the lighting device pertaining to an aspect of the present disclosure. FIG. 7 is an exploded perspective view diagram depicting the lighting device pertaining to an aspect of the present disclosure. As depicted in FIGS. 6 and 7, the lighting device 6 is a lamp unit including, for example, a light-emitting module 10, a base 20, a holder 30, a decorative cover 40, a cover 50, a cover pressing member 60, a wiring member 70, and so on.

(Light-Emitting Module)

Figure 8A:
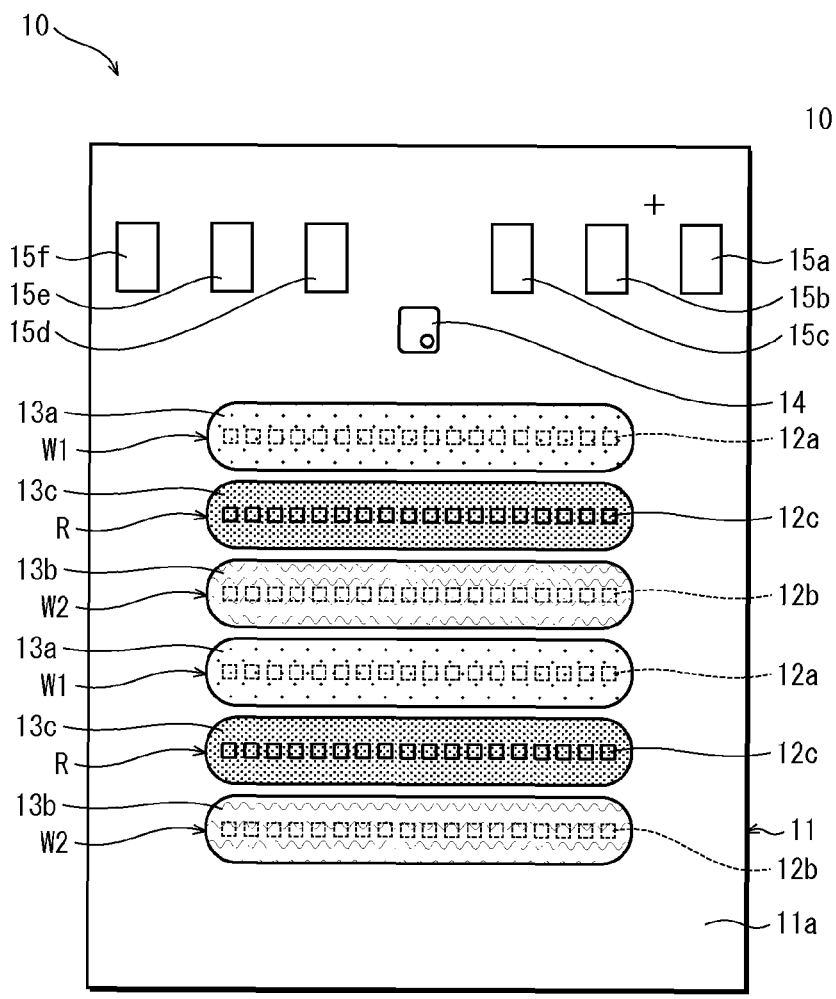
FIGS. 8A, 8B, and 8C depict a light-emitting module pertaining to the aspect of the present disclosure, FIG. 8A being a plan view, FIG. 8B being a right-side view, and FIG. 8C being a front view.
Figure 8B:
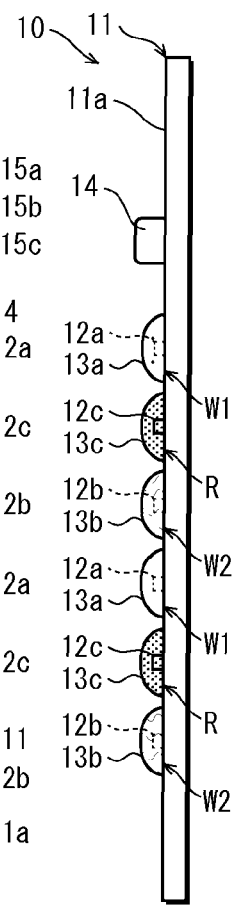
Figure 8C:
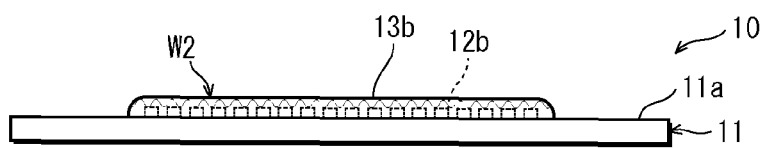
Figure 9:
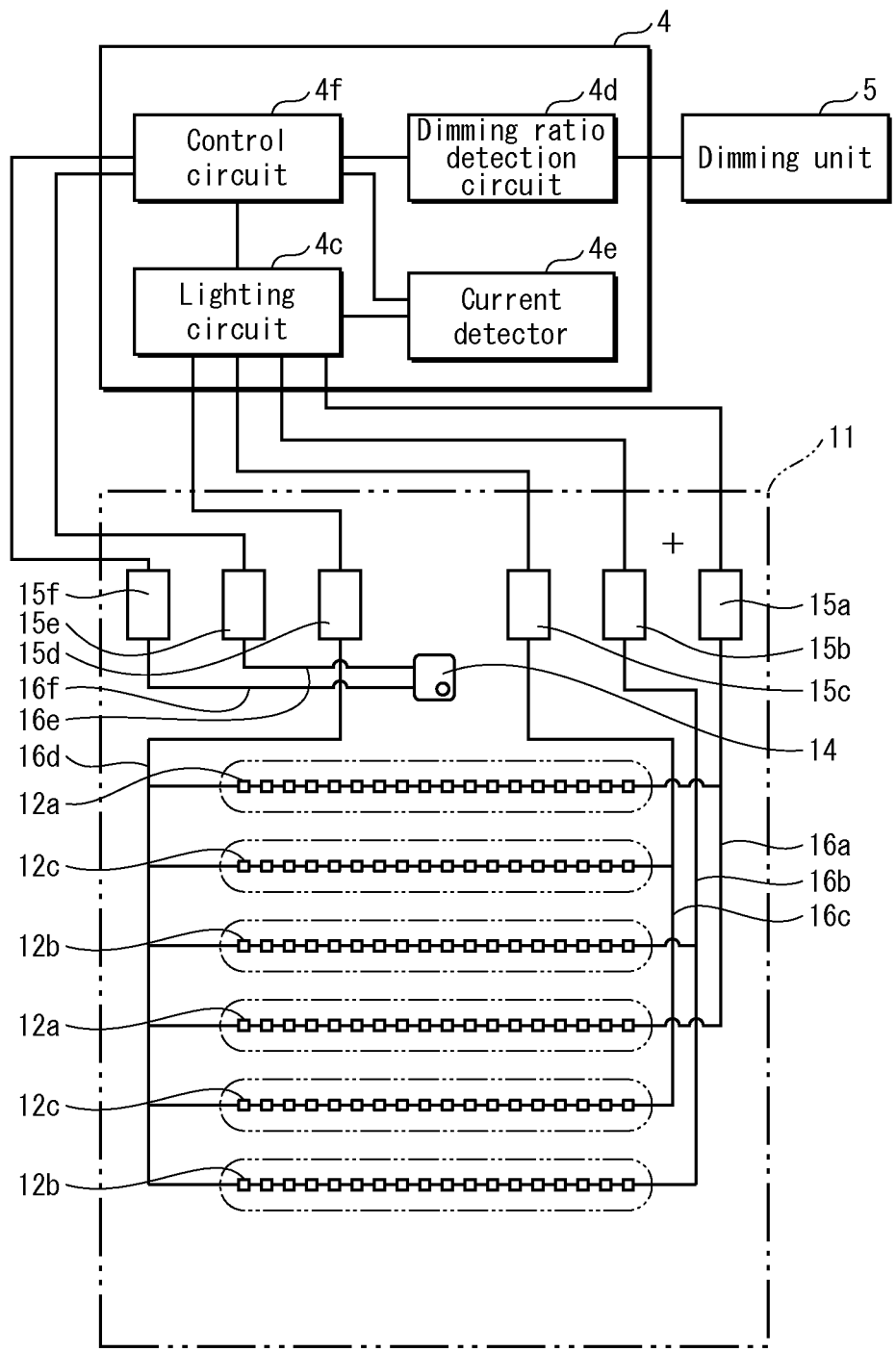
FIG. 9 is a wiring diagram describing connections between the light-emitting module and a circuit unit pertaining to the aspect of the present invention.

FIGS. 8A, 8B, and 8C depict the light-emitting module pertaining to the aspect of the present disclosure, FIG. 8A being a plan view, FIG. 8B being a right-side view, and FIG. 8C being a front view. FIG. 9 is a wiring diagram describing connections between the light-emitting module and the circuit unit pertaining to an aspect of the present invention. For ease of understanding of the arrangement of light sources W1, W2, and R, FIGS. 8A, 8B, and 8C depict the light sources W1, W2, and R with matching patterns for components of the same color and different patterns for components of different colors.

As depicted in FIGS. 8A, 8B, 8C, and 9, the light-emitting module 10 includes a substrate 11, light-emitting elements 12a, 12b, and 12c, sealer members 13a, 13b, and 13c, a temperature detector 14, terminals 15a through 15f, and wiring 16a through 16f.

The substrate 11 is, for example, rectangular, having a two-layer structure combining an insulation layer made of a ceramic substrate, a heat-conducting resin, or similar, and a metallic layer made of an aluminum plate or similar. The light-emitting elements 12a, 12b, and 12c are mounted on a top face 11a of the substrate 11.

The light-emitting elements 12a, 12b, and 12c are, for example, arranged as six parallel rows, each row being an element row of 18 light-emitting elements 12a, 12b, or 12c in a straight line. The light-emitting elements 12a, 12b, and 12c are, for example, LEDs mounted face up using Chip-on-Board (hereinafter, COB) technology on the upper surface 11a of the substrate 11. Here, the light-emitting elements pertaining to the present disclosure may be, for example, laser diodes (hereinafter, LD) or electroluminescence elements (hereinafter, EL elements).

The sealer members 13a, 13b, and 13c individually seal the light-emitting elements 12a, 12b, and 12c into element rows. The sealer members 13a, 13b, and 13c are, for example, elongated members each having a cross-section, taken along a virtual plane intersecting the longitudinal direction, that is substantially semi-elliptical (see FIG. 8B). Also, both ends of the sealer members 13a, 13b, and 13c in the longitudinal direction are rounded (substantially being four semi-spheres). As seen in a plan view, the ends in the longitudinal direction are shaped as semi-circles, as depicted in FIG. 8A. The shape of the sealer members 13a, 13b, and 13c is arbitrary and non-limiting, and may also be rectangular, for example. Also, the sealer members 13a, 13b, and 13c may be connected by connecting members made of a translucent material, so as to be continuous.

The sealer members 13a, 13b, and 13c are, for example, made of a translucent material. The translucent material may be, for example, a silicone resin, an epoxy resin, a fluorine resin, a silicone epoxy hybrid resin, a urea resin, and so on. A first sealer member 13a and a second sealer member 13b function as wavelength converter members, given that a wavelength converter material is combined with the translucent material therein. The wavelength converter material may be, for example, phosphor particles. In the following explanations, the first sealer member 13a is termed a first wavelength converter member 13a, and the second sealer member 13b is termed a second wavelength converter member 13b. In contrast, the third sealer member 13c does not function as a wavelength converter member given that the wavelength converter material is not combined with the translucent material. A dispersion material may be combined with the translucent material of the third sealer member 13c.

Each of the light sources W1, W2, and R is configured from 18 of the light-emitting elements 12a, 12b, or 12c aligned in one element row and one of the sealer members 13a, 13b, or 13c sealing those light-emitting elements 12a, 12b, or 12c. The shape of the light sources W1, W2, and R is elongated and dependent on the shape of the sealer members 13a, 13b, and 13c, which are arranged in parallel with equal spacing therebetween so that both edges are uniform. The quantity of the light-emitting elements 12a, 12b, and 12c sealed by each of the sealer members 13a, 13b, and 13c is arbitrary. Also, the respective shapes of the sealer members 13a, 13b, and 13c and of the light sources W1, W2, and R is arbitrary and not limited to being elongated. For example, the block shape of Variation 1, the annular shape of Variation 2, and the dot shape of Variation 3 are all applicable.

Two of the light sources W1, W2, and R are provided for each color. In order to prevent discoloration of the light-emitting module 10, the light sources W1, W2, and R are not disposed next to another light source of the same color, and the red light source R is disposed between the first white light source W1 and the second white light source W2. Specifically, the order of arrangement is first white light source W1, red light source R, second white light source W2, first white light source W1, red light source R, second white light source W2.

The first white light source W1 includes a first light-emitting element 12a and a first wavelength converter member 13a converting a portion of the light from the first light-emitting elements 12a, and thus produces first white light obtained by combining light from the first light-emitting element 12a that is converted by the first wavelength converter member 13a and light from the first light-emitting element 12a that is not converted by the first wavelength converter member 13a. The first light-emitting element 12a is, for example, an LED emitting blue light having a peak wavelength of no less than 450 nm and no more than 470 nm. The first wavelength converter member 13a performs, for example, wavelength conversion of the blue light from the first light-emitting element 12a into light having a peak wavelength of no less than 535 nm and no more than 555 nm, as well as a full width at half maximum of no less than 50 nm and no more than 70 nm.

The first light-emitting element of the present disclosure is not limited to a blue light-emitting element emitting blue light having a peak wavelength of no less than 450 nm and no more than 470 nm. A blue light-emitting element emitting blue light having a different wavelength, or a light-emitting element emitting ultraviolet light may also be used. Also, the first wavelength converter of the present disclosure is a wavelength converter producing converted light having a peak wavelength of no less than 535 nm and no more than 555 nm with a full width at half maximum of no less than 50 nm and no more than 70 nm, and may be an oxynitride phosphor having a sialon structure, an oxynitride phosphor, a sulfide phosphore, a silicate phosphor, and a compound including at least two of the listed phosphors.

The second white light source W2 includes a second light-emitting element 12b and a second wavelength converter member 13b converting a portion of the light from the second light-emitting element 12b, and thus produces second white light obtained by combining light from the second light-emitting element 12b that is converted by the second wavelength converter member 13b and light from the second light-emitting element 12b that is not converted by the second wavelength converter member 13b. The second light-emitting element 12b is, for example, a blue light-emitting element light having a peak wavelength of no less than 450 nm and no more than 470 nm, similar to the first light-emitting element 12a. The second wavelength converter member 13b performs wavelength conversion of a portion of the light from the second light-emitting element 12b into light having a different spectrum than the light converted by the first wavelength converter member 13a in terms of at least one of the peak wavelength and the full width at half maximum. Specifically, the converted light has, for example, a peak wavelength of no less than 540 nm and no more than 580 nm as well as a full width at half maximum of no less than 100 nm and no more than 130 nm, Accordingly, the change in FCI is effectively constrained.

The second light-emitting element of the present disclosure is not limited to a blue light-emitting element emitting blue light having a peak wavelength of no less than 450 nm and no more than 470 nm. A blue light-emitting element emitting blue light having a different wavelength, or a light-emitting element emitting ultraviolet light may also be used.

Also, the second wavelength converter of the present disclosure is a wavelength converter producing converted light having a peak wavelength of no less than 540 nm and no more than 580 nm with a full width at half maximum of no less than 100 nm and no more than 130 nm, and may be an aluminate phosphor having a garnet structure, a silicate phosphor, an oxynitride phosphor having a sialon structure, an oxynitride phosphor, and a compound including at least two of the listed phosphors.

The second light-emitting element of the present disclosure is not limited to a blue light-emitting element emitting blue light having a peak wavelength of no less than 450 nm and no more than 470 nm. A blue light-emitting element emitting blue light having a different wavelength, or a light-emitting element emitting ultraviolet light may also be used.

The second wavelength converter member of the present disclosure is not limited to performing wavelength conversion into light having a peak wavelength of no less than 540 nm and no more than 580 nm with a full width at half maximum of no less than 100 nm and no more than 130 nm. Any conversion producing converted light having a spectrum shifted toward longer wavelengths relative to the first wavelength converter member is beneficial. Also, the wavelength converter producing converted light having a peak wavelength of no less than 540 nm and no more than 580 nm with a full width at half maximum of no less than 100 nm and no more than 130 nm may be an aluminate phosphor having a garnet structure, a silicate phosphor, an oxynitride phosphor having a sialon structure, an oxynitride phosphor, and a compound including at least two of the listed phosphors.

Further, the second wavelength converter 13b may be a different type of wavelength converter material than the first wavelength converter 13a or may combine the same type of wavelength converter material in different proportions. Also, the wavelength converter material used for the first wavelength converter 13a and for the second wavelength converter 13b may be a simple chemical compound, or may combine a plurality of chemical compounds.

The red light source R includes a third light-emitting element 12c and the third sealer member 13c, and produces red light. The third light-emitting element 12c is, for example, a red light-emitting element emitting red light having a peak wavelength of no less than 615 nm and no more than 640 nm. The third light-emitting element 12c is also termed a red light-emitting element 12c, below. The third sealer member 13c is transparent, having no wavelength converter material combined with the translucent material. However, a dispersion material may be combined with the translucent material of the third sealer member 13c.

The red light-emitting element 12c beneficially produces light having a peak wavelength of no less than 620 nm and no more than 626 nm under the first lighting conditions, and light having a peak wavelength of no less than 623 nm and no more than 630 nm under the second lighting conditions. Also, as described later, when the first white light source W1 and the second white light source W2 are actively lit simultaneously, the red light-emitting element 12c more beneficially produces light having a peak wavelength of no less than 623 nm and no more than 626 nm during a transition period from the first lighting conditions to the second lighting conditions.

The temperature detector 14 is, for example, a temperature sensing integrated circuit (hereinafter, IC) provided on the upper surface 11a of the substrate 11, and detecting the temperature of the red light-emitting element 12c. Temperature information obtained as a detection result is output to a control circuit 4f of the circuit unit 4. The specific detection method used to detect the temperature of the red light-emitting element 12c may involve directly detecting the temperature of the red light-emitting element 12c, or may involve indirect detection based on the temperature of the substrate 11, the temperature of a member disposed in the periphery of the red light-emitting element 12c, the atmospheric temperature around the light-emitting elements 12a, 12b, and 12c, or similar. The temperature detector pertaining to the present disclosure is not limited to being a temperature sensor IC, but may also be any component capable of directly or indirectly detecting the temperature of the third light-emitting element. For example, when a later-described lighting circuit is incorporated with the substrate of the light-emitting module, a thermistor may be inserted into the lighting circuit and the thermistor may serve as the temperature detector.

The terminals 15a through 15f are configured from a conductor pattern formed on the substrate 11. Terminal 15a and terminal 15d serve to supply power to the first light-emitting element 12a. Terminal 15b and terminal 15d serve to supply power to the second light-emitting element 12b. Terminal 15c and terminal 15d serve to supply power to the red light-emitting element 12c. Terminal 15e and terminal 15f serve as connection terminals electrically connecting the temperature detector 14 and the circuit unit 4. As depicted in FIG. 9, the terminals 15a through 15f are formed at the periphery of the upper surface 11a of the substrate 11.

The wiring 16a through 16f is also configured from a conductor pattern formed on the substrate 11. Wiring 16a electrically connects the first light-emitting element 12a and terminal 15a, wiring 16b electrically connects the second light-emitting element 12b and terminal 15b, and wiring 16c electrically connects the red light-emitting element 12c and terminal 15c. Also, wiring 16d electrically connects the respective light-emitting elements 12a, 12b, and 12c with terminal 15d. Wiring 16e and 16f electrically connects the temperature detector 14 to respective terminals 15e and 15f.

The light-emitting elements 12a, 12b, and 12c are connected in series-parallel as two parallel series of 18 for each of the light sources W1, W2, and R. Specifically, 18 of the light-emitting elements 12a, 12b, and 12c respectively making up a single element row are connected in series, and element rows for the same color light source W1, W2, and R are connected in parallel. Thus, individual lighting control is performed by color for each of the light sources W1, W2, and R.

The light-emitting module described above is able to produce illumination light having a stable FCI unaffected by the lighting conditions, through white light source switching control performed by the lighting circuit as described below.

(Base)

Returning to FIG. 7, the base 20 is, for example, a disc made of die-cast aluminum, having a mounting part 21 at the center of an upper surface. The light-emitting module 10 is mounted on the mounting part 21. The base 20 also has screw holes 22 provided in the upper surface of the base 20 on either side of the mounting part 21. Assembly screws 35 screw into the screw holes 22 to fix the holder 30. The periphery of the base 20 is provided with through-holes 23, boss holes 24, and a notch 25. The respective roles of the through-holes 23, the boss holes 24, and the notch 25 are described later.

(Holder)

The holder 30 is, for example, a bottomed cylinder, and includes a holder plate 31 that is discoid and a peripheral wall 32 that is tubular and extends from the periphery of the holder plate toward the base 20. The light-emitting module 10 is fixed to the base 20 by the holder plate 31 pressing light-emitting module 10 against the mounting part 21.

A window 33 for exposing the light sources W1, W2, and R of the light-emitting module 10 is provided at the center of the holder plate 31. Also, an opening 34 is provided at the periphery of the holder plate 31 in order to prevent lead lines 71 connected to the light-emitting module 10 from interfering with the holder 30, and is formed continuously with the window 33. Furthermore, through-holes 36 are provided are provided at the periphery of the holder plate 31 of the holder 30 at positions corresponding to the screw holes 22 of the base 20 for the assembly screws 35 to pass therethrough.

When affixing the holder 30 onto the base 20, the substrate 11 of the light-emitting module 10 is first held sandwiched between the base 20 and the holder 30, with the light sources W1, W2, and R being exposed through the window 33 of the holder 30. Next, the assembly screws 35 are passed through the through-holes 36 intended therefor from above the holder plate 31 of the holder 30. The holder 30 is affixed to the base 20 by the assembly screws 35 screwing into the screw holes 22 of the base 20.

(Decorative Cover)

The decorative cover 40 is, for example, an annular non-translucent member composed from opaque white resin or similar, is disposed between the holder 30 and the cover 50, and covers the lead wire 71, the assembly screws 35, and other components exposed by the opening 34 from view. A window 41 is formed in the center of the decorative cover 40 to expose the light sources W1, W2, and R.

(Cover)

The cover 50 is, for example, formed from a translucent material such as a silicone resin, an acrylic resin, or glass. Light emitted by the light sources W1, W2, and R passes through the cover 50 and exits the lighting device 6. The cover 50 includes a main body 51 serving as a dome-shaped lens covering the light sources W1, W2, and R, and an outer flange 52 extending outward from the periphery of the main body 51. The outer flange 52 is fixed to the base 20.

(Cover Pressing Member)

The cover pressing member 60 is, for example, formed of a non-translucent material such as aluminum or a similar metal, or of an opaque white resin, in an annular shape so as to avoid blocking the light emitted through the main body 51 of the cover 50. The outer flange 52 of the cover 50 is held fixed between the cover pressing member 60 and the base 20.

Boss parts 61 are provided on the lower surface of the cover pressing member 60, being columnar and protruding toward the base 20. Semi-circular notches 53 are formed in the outer flange 52 of the cover 50 at positions corresponding to the boss parts 61, in order to avoid the boss parts 61. Furthermore, boss holes 24 for allowing the boss parts 61 to pass are provided in the periphery of the base 20 at a position corresponding to the boss parts 61. When fixing the cover pressing member 60 to the base 20, the boss parts 61 of the cover pressing member 60 are passed through the boss holes 24 of the base 20. A front end portion of each of the boss members 61 is exposed to laser light from below the base 20 and undergoes plastic deformation so that the respective end portions do not fall from the boss holes 24. Thus, the cover pressing member 60 is fixed to the base 20.

Notches 54 and 62 are respectively formed in the outer flange 52 of the cover 50 and the periphery of the cover pressing member 60. The notches 54 and 62 are semi-circular and are located at positions corresponding to the through-holes 23 in the base 20 so that (non-diagrammed) fixing screws passing through the through-holes 23 do not come into contact with the cover pressing member 60 and the cover 50.

(Wiring Member)

The wiring member 70 includes the pair of lead lines 71 electrically connected to the light-emitting module 10. The connector 72 is affixed to an end of the lead lines 71 opposite the side thereof connected to the light-emitting module 10. The lead lines 71 of the wiring member 70, being connected to the light-emitting module 10, are guided out of the lighting device 6 via the notch 25 of the base 20.

<Lighting Control>

(Circuit Configuration)

As depicted in FIG. 9, the circuit unit 4 is a lighting circuit unifying a lighting circuit 4c, a dimming ratio detection circuit 4d, a current detector 4e, and a control circuit 4f. The circuit unit 4 is electrically connected to a (non-diagrammed) commercial alternating current power source and supplies current input from the commercial alternating current power source to the light-emitting module 10. The circuit unit 4 also performs separate lighting control for each color of the light sources W1, W2, and R. In other words, the circuit unit 4 performs individual lighting control for the first white light source W1, the second white light source W2, and the red light source R.

The lighting circuit 4c is configured from a circuit that includes a (non-diagrammed) AC/DC converter, and supplies power individually to the first light-emitting element 12a, the second light-emitting element 12b, and the red light-emitting element 12c. Specifically, the lighting circuit 4c converts the alternating current voltage from the commercial alternating current power source into a direct current voltage appropriate for the first light-emitting element 12a, a direct current voltage appropriate for the second light-emitting element 12b, and a direct current voltage appropriate for the red light-emitting element 12c. The lighting circuit 4c then applies the direct current voltage appropriate to each light-emitting element 12a, 12b, and 12c to the respective light-emitting elements 12a, 12b, and 12c as forward voltage, in accordance with an instruction from the control circuit 4f. The AC/DC converter may be, for example, a diode bridge or similar.

The dimming ratio detection circuit 4d acquires a dimming signal from the dimming unit 5. The dimming unit 5 outputs the dimming signal to the dimming ratio detection circuit 4d upon receiving a user instruction or similar. The dimming signal includes dimming ratio information. The dimming ratio is an optical flux ratio relative to the full illumination (100% illumination) of the first light-emitting element 12a, the second light-emitting element 12b, and the red light-emitting element 12c. The dimming ratio information is output from the dimming ratio detection circuit 4d to the control circuit 4f.

The current detector 4e is, for example, a current-detecting resistor inserted serially onto the current circuit leading from the lighting circuit 4c to the red light-emitting element 12c, and detects the current flowing to the red light-emitting element 12c. The current detector 4e then outputs current information obtained as a detection result to the control circuit 4f. The method of detecting the current flowing in the red light-emitting element 12c used by the current detector 4e is not limited to the above.

The control circuit 4f includes a microprocessor and memory. The control circuit 4f controls the brightness of the first light-emitting element 12a, the second light-emitting element 12b, and the red light-emitting element 12c by performing dimming control thereon using the microprocessor, in accordance with the dimming ratio input from the dimming ratio detection circuit 4d. Specifically, the control circuit 4f individually sets the duty ratio of the first light-emitting element 12a, the second light-emitting element 12b, and the red light-emitting element 12c in accordance with the dimming ratio, and performs pulse-width modification (hereinafter, PWM) control of the first light-emitting element 12a, the second light-emitting element 12b and the red light-emitting element 12c. In addition, the control circuit 4f performs the following white light source switching control in accordance with the temperature information acquired from the temperature detector 14 and the current information acquired from the current detector 4e.

(White Light Source Switching Control)

FIG. 10 is a flowchart describing the operations of the white light source switching control. As depicted in FIG. 10, the white light source switching control pertaining to the present Embodiment begins when an ON-OFF switch of the lighting equipment 1 is switched ON. At this time, the lighting circuit 4c begins supplying electric power to the first light-emitting element 12a, lighting the first white light source W1 (step S1), and begins supplying electric power to the red light-emitting element 12c, lighting the red light source R (step S2). The electric power is most beneficially supplied simultaneously to the first white light source W1 and to the red light source R. Otherwise, supplying the first white light source W1 first is beneficial, though the second white light source W2 may also be supplied first.

Once the first white light source W1 and the red light source R have been lit, the control circuit 4f performs monitoring until the switch is switched OFF (YES in step S3). The control circuit 4f monitors whether the temperature of the red light-emitting element 12c is equal to or greater than a threshold (step S4) and whether or not the current flowing in the red light-emitting element 12c is equal to or greater than a threshold (step S5).

When either one of the temperature and the current is equal to or greater than the threshold (YES in step S4 or YES in step S5), the lighting circuit 4c lights the second white light source W2 by beginning to supply electric power to the second light-emitting element 12b (step S6) and extinguishes the first white light source W1 by stopping the supply of electric power to the first light-emitting element 12a (step S7). That is, the white light source is switched from the first white light source W1 to the second white light source W2. Beneficially, the lighting circuit 4c simultaneously begins supplying the electric power to the second light-emitting element 12b and stops supplying the electric power to the first light-emitting element 12a. However, the supply of electric power to the second light-emitting element 12b may also begin before the supply of the electric power to the first light-emitting element 12a ends.

Once the white light source has been switched, the control circuit 4f performs monitoring until the switch is switched OFF (YES in step S8). The control circuit 4f monitors whether the temperature of the red light-emitting element 12c is equal to or greater than a threshold (step S9) and whether or not the current flowing in the red light-emitting element 12c is equal to or greater than a threshold (step S10).

When either one of the temperature and the current is no longer equal to or greater than the threshold (NO in step S9 and NO in step S10), the lighting circuit 4c lights the first white light source W1 by beginning to supply the electric power to the first light-emitting element 12a (step S11) and extinguishes the second white light source W2 by stopping the supply of electric power to the second light-emitting element 12b (step S12). That is, the white light source is switched from the second white light source W2 to the first white light source W1. Beneficially, the lighting circuit 4c simultaneously begins supplying the electric power to the first light-emitting element 12a and stops supplying the electric power to the second light-emitting element 12b. However, the supply of electric power to the first light-emitting element 12a may also begin before the supply of the electric power to the second light-emitting element 12b ends.

Once the white light source has been switched, the process returns to step S3, where the control circuit 4f performs monitoring until the switch is switched OFF (YES in step S3). The control circuit 4f monitors whether the temperature of the red light-emitting element 12c is equal to or greater than the threshold (step S4) and whether or not the current flowing in the red light-emitting element 12c is equal to or greater than the threshold (step S5).

In step S3, when the switch is switched OFF (YES in step S3), the red light source R is extinguished by stopping the power supply to the red light-emitting element 12c (step S13) and the first white light source W1 is extinguished by stopping the power supply to the first light-emitting element 12a (step S14). The lighting equipment 1 is thus fully extinguished.

Similarly, in step S8, when the switch is switched OFF (YES in step S8), the red light source R is extinguished by stopping the power supply to the red light-emitting element 12c (step S15) and the second white light source W2 is extinguished by stopping the power supply to the second light-emitting element 12b (step S16). The lighting equipment 1 is thus fully extinguished.

Accordingly, the lighting equipment 1 has at least two lighting states. In the first state, the first white light source W1 is lit while the second white light source W2 is not lit. Control for this state is performed under the first lighting conditions. In the second state, the second white light source W2 is lit while the first white light source W1 is not lit. Control for this state is performed under the second lighting conditions.

The first lighting conditions are conditions in which the peak wavelength of the red light-emitting element 12c have a first value, or in other words, conditions in which the peak wavelength of the red light-emitting element 12c is not shifted toward longer wavelengths. In the present Embodiment, the red light-emitting element 12c is lit with a first temperature and a first current under the first lighting conditions.

The second lighting conditions are conditions in which the peak wavelength of the red light-emitting element 12c have a second value, or in other words, conditions in which the peak wavelength of the red light-emitting element 12c has been shifted toward longer wavelengths. In the present Embodiment, the red light-emitting element 12c is lit with a second temperature that is higher than the first temperature, is lit with a second current that is greater than the first current, or both, under the second lighting conditions.

The temperature threshold is set within a range that exceeds the first temperature and is equal to or less than the second temperature. For example, given a first temperature of 25° C. and a second temperature of 70° C., the threshold may be set to 70° C. The current threshold is set within a range that exceeds the first current and is equal to or less than the second current. For example, given a first current of 25 mA and a second current of 60 mA, the current threshold may be set to 60 mA.

When the temperature and the current are both below the respective thresholds, that is, under the first lighting conditions, the first white light source W1 is lit while the second white light source W2 is not lit. When at least one of the temperature and the current reaches or exceeds the threshold, that is, when the second lighting conditions are reached, then the second white light source W2 is lit instead of the first white light source W1. That is, the state changes from the first light-emitting element 12a being lit while the second light-emitting element 12b is not lit, to the second light-emitting element 12b being lit while the first light-emitting element 12a is not lit.

Under the first lighting conditions, the peak wavelength of the light from the red light-emitting element 12c is not shifted toward longer wavelengths. Thus, the first white light source W1 is suitable as the white light source while the second white light source W2 is not. The first white light source W1 is optimized for obtaining a desired FCI by combining with the red light-emitting element 12c when the peak wavelength of the latter is not shifted toward longer wavelengths. Thus, the desired FCI is obtained under the first lighting conditions.

Conversely, under the second lighting conditions, the peak wavelength of the light from the red light-emitting element 12c is shifted toward longer wavelengths. A transition from the first lighting conditions to the second lighting conditions occurs as the peak wavelength of the light from the red light-emitting element shifts toward longer wavelengths. Here, the lit white light source is changed from the first white light source W1 to the second white light source W2. The second white light source W2 is optimized for obtaining a desired FCI by combining with the red light-emitting element 12c when the peak wavelength of the latter is shifted toward longer wavelengths. Thus, the desired FCI is obtained under the second lighting conditions.

[Variations]

Variations on the lighting equipment, the lighting device, and the light-emitting module of the present disclosure are described below.

(White Light Source Switching Control)

In the above-described Embodiment, the white light source is switched in accordance with the temperature of the red light-emitting element 12c and the current flowing in the red light-emitting element 12c. However, the white light source may also be switched in accordance with the temperature of the red light-emitting element 12c, only. In such a case, the red light-emitting element 12c is lit at the first temperature under the first lighting conditions, and the red light-emitting element 12c is lit at the second temperature that is higher than the first temperature under the second lighting conditions. Also, steps S5 and S10 are omitted from the white light source switching control indicated in FIG. 10. Specifically, in step S4, when the temperature of the red light-emitting element 12c is equal to or greater than the threshold (YES in step S4), the process advances to step S6. When the temperature of the red light-emitting element 12c is not equal to or greater than the threshold (NO in step S4), the process returns to step S3. Also, in step S9, when the temperature of the red light-emitting element 12c is not equal to or greater than the threshold (NO in step S9), the process advances to step S11. When the temperature of the red light-emitting element 12c is equal to or greater than the threshold (YES in step S9), the process returns to step S8.

The switching of the white light source may also be performed in accordance with the current flowing in the red light-emitting element 12c, only. In such a case, the red light-emitting element 12c is lit with the first current under the first lighting conditions, and the red light-emitting element 12c is lit with the second current that is greater than the first current under the second lighting conditions. Also, steps S4 and S9 are omitted from the white light source switching control indicated in FIG. 10. Specifically, when the result of step S3 is NO, the process advances to step S5, and when the result of step S8 is NO, the process advances to step S10.

Also, in the above-described Embodiment, the first white light source W1 and the second white light source W2 are not actively lit at the same time. However, during the transition from the first lighting conditions to the second lighting conditions, a third state may be provided in which the first white light source W1 and the second white light source W2 are lit at the same time. This provides a buffer against a sudden change in lighting conditions and enables discomfort accompanying the change in white light source to be slightly reduced. In the third state, dimming control is beneficially performed such that the total brightness of the first white light source W1 and the second white light source W2 is equal to the brightness of the first white light source W1 under the first lighting conditions or to the brightness of the second white light source W2 under the second lighting conditions.

Also, in the above-described Embodiment, the second light-emitting element 12b is not lit while the red light-emitting element 12c is lit under the first lighting conditions. However, the second light-emitting element 12b may be slightly lit, to an extent that does not substantially affect the appearance of objects (e.g., the FCI). Furthermore, in the above-described Embodiment, the first light-emitting element 12a is not lit while the red light-emitting element 12c is lit under the second lighting conditions. However, the first light-emitting element 12a may be slightly lit, to an extent that does not substantially affect the appearance of objects (e.g., the FCI). Here, the meaning of the term "substantially not lit" includes situations where lighting is not performed at all and where lighting is incomplete, such that the lighting does not substantially influence the appearance of objects.

Finally, the switching of the white light source may also be performed in accordance with another cause unrelated to the temperature and the current, such as a third light-emitting element having a peak wavelength that is shifted toward longer wavelengths.

(Light-Emitting Module)

The light emitting module of the present disclosure is not limited to the light emitting module 10 pertaining to the above-described Embodiment.

For example, the light-emitting module 10 of the above-described Embodiment is described as having two of each light source per color. However, the quantity of light sources is arbitrary. For instance, one of each light source per color or three or more light sources per color may also be provided. Further, the same quantity of light sources need not necessarily be provided for each color. For example, twice as many of the first white light source and the second white light source than the red red light source may be provided. The quantity of light sources in each color is arbitrary. Any combination may apply provided that at least one light source of each color is present.

Also, the light sources are described above as being configured from 18 of the light-emitting elements. However, the quantity of light-emitting elements in the light source configuration is optional. For example, a single light source may be configured from one light-emitting element and one sealer member, or a single light source may be configured from a plurality of light-emitting elements in a quantity other than 18, and one sealer member. Also, the quantity of light-emitting elements in each light source need not necessarily be equal.

Further, the light-emitting module may include a light source of a color other than the first white, the second white, and red.

Also, the light-emitting module 10 of the above-described Embodiment uses a sealer member 13 having an elongated linear shape. However, the shape of the light sources W1, W2, and R in the present disclosure is arbitrary. That is, each light source need not necessarily have the shape of a straight line, and may have the shape of a curved line. Furthermore, each light source may have a block shape. Further still, the shapes of a straight line, a curved line, and a block may be combined. The arrangement of the light sources W1, W2, and R is also arbitrary.

Variations in the shape and arrangement of the light sources W1, W2, and R are described below. Components identical to those already described use the same reference signs, and accordingly, description thereof is simplified or omitted. For ease of understanding of the arrangement of light sources W1, W2, and R, the light sources W1, W2, and R are depicted with matching patterns for components of the same color and different patterns for components of different colors.

Figure 11A:
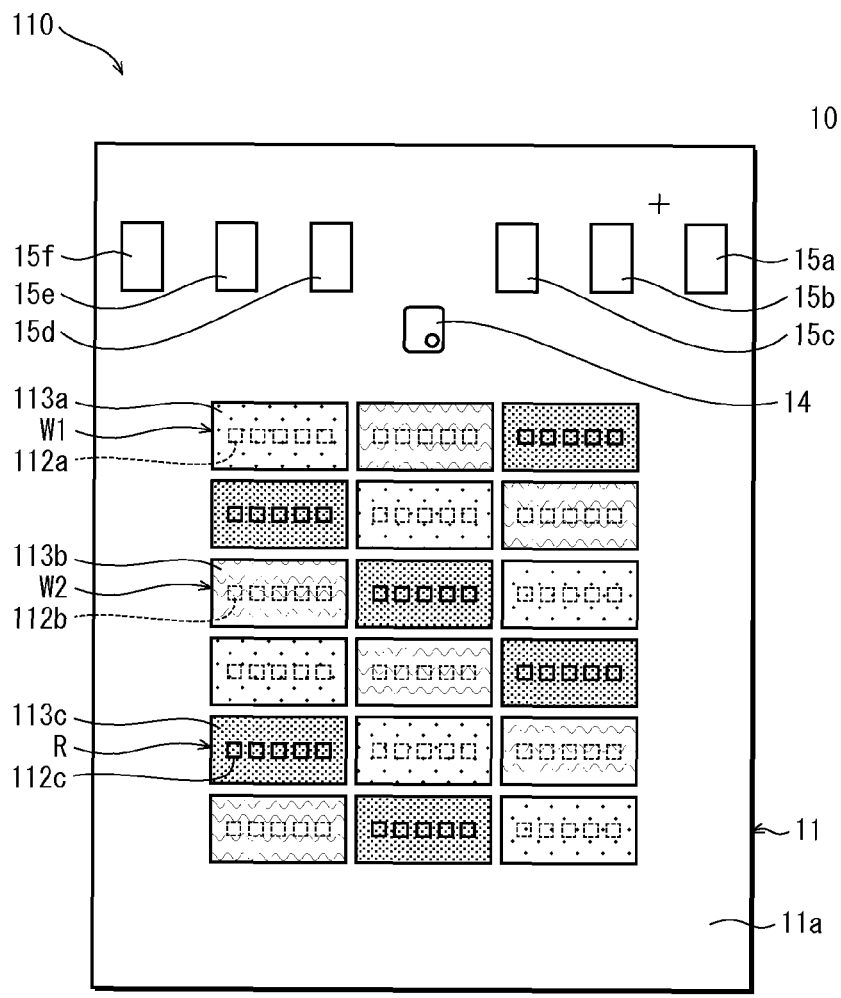
FIGS. 11A, 11B, and 11C depict a light-emitting module pertaining to Variation 1, FIG. 11A being a plan view, FIG. 11B being a right-side view, and FIG. 11C being a front view.
Figure 11B:
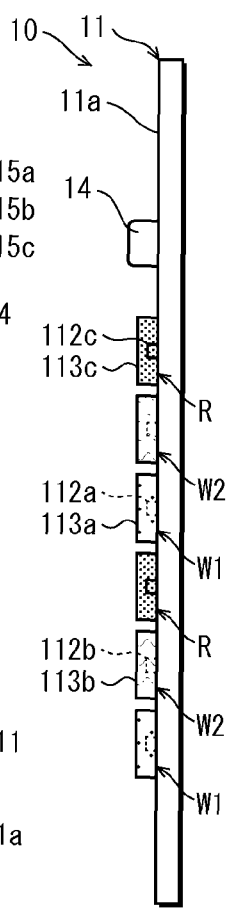
Figure 11C:
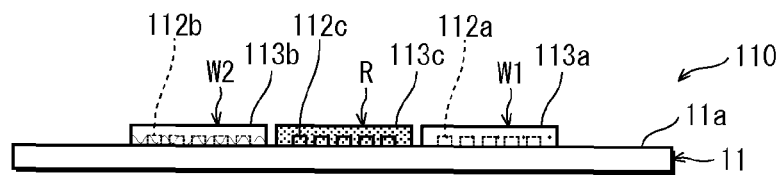

FIGS. 11A, 11B, and 11C depict the light-emitting module pertaining to Variation 1, FIG. 11A being a plan view, FIG. 11B being a right-side view, and FIG. 11C being a front view. For example, the light-emitting module 110 pertaining to Variation 1 as depicted in FIGS. 11A, 11B, and 11C has the light sources W1, W2, and R shaped as rectangles, which are a type of block. These rectangles are arranged in a matrix. Each of the light sources W1, W2, and R is configured from a plurality of light-emitting elements 112a, 112b, or 122c arranged in a row that is a straight line, and a sealer member 113a, 113b, or 113c sealing the light-emitting elements 112a, 112b, or 112c. The light sources W1, W2, and R are then arranged in a zigzag pattern such that no neighboring pairs are of the same color. As such, reducing the size of the individual light sources W1, W2, and R while increasing the quantity of the light sources W1, W2, and E evenly combines the light from the light sources W1, W2, and R, making discoloration less likely to occur.

Figure 12A:
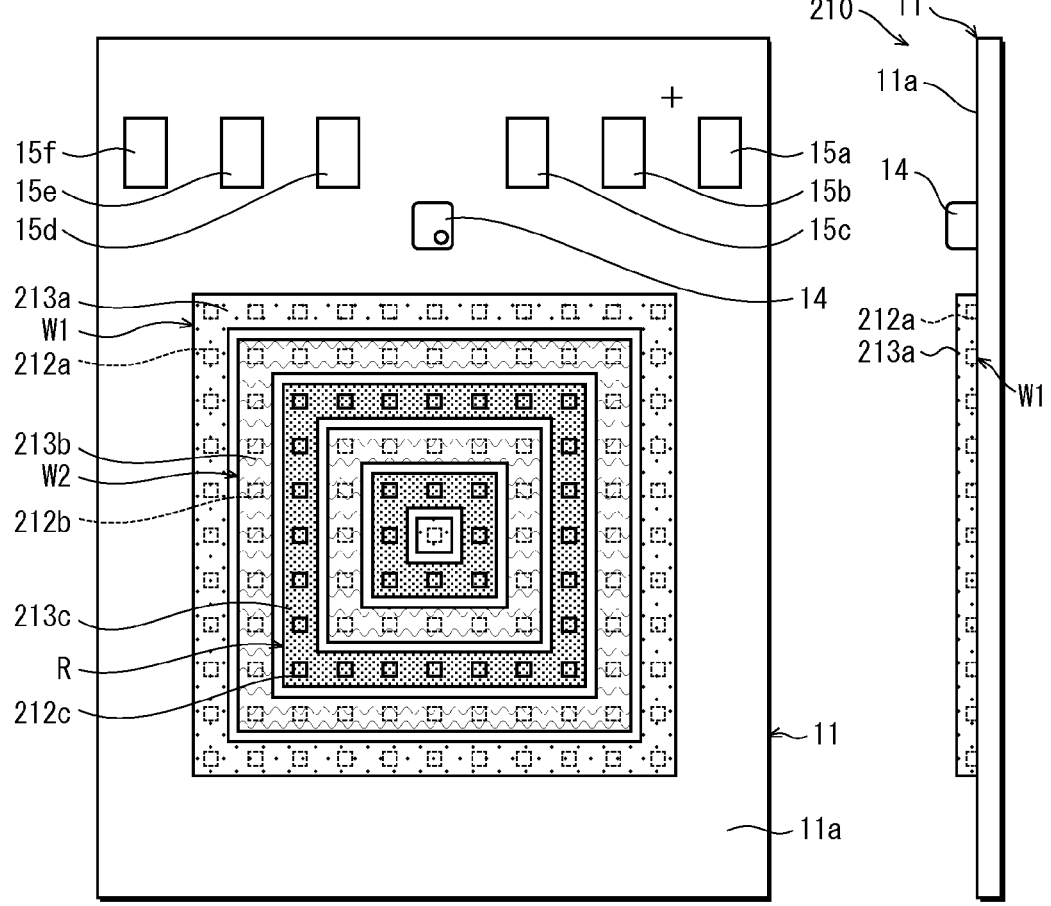
FIGS. 12A, 12B, and 12C depict a light-emitting module pertaining to Variation 2, FIG. 12A being a plan view, FIG. 12B being a right-side view, and FIG. 12C being a front view.
Figure 12B:
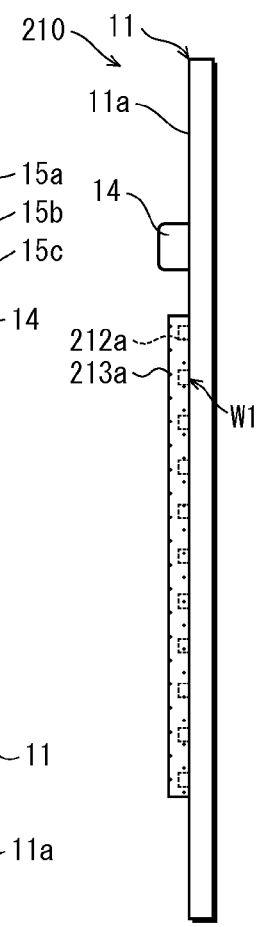
Figure 12C:
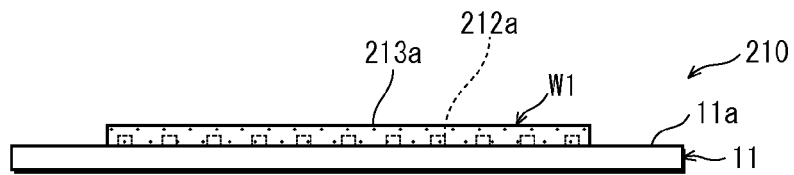

FIGS. 12A, 12B, and 12C depict the light-emitting module pertaining to Variation 2, FIG. 12A being a plan view, FIG. 12B being a right-side view, and FIG. 12C being a front view. The light-emitting module 210 pertaining to Variation 2 depicted in FIGS. 12A, 12B, and 12C has the light sources W1, W2, and R shaped as rectangular rings, which are a type of ring. These rings are arranged in alternation about a common annular axis. Each of the light sources W1, W2, and R is configured from a plurality of light-emitting elements 212a, 212b, or 222c arranged in a ring, and a sealer member 213a, 213b, or 213c sealing the light-emitting elements 212a, 212b, or 212c. As such, making the light sources W1, W2, and R annular enables illumination light to be produced with no discoloration for 360° around the annular axis.

FIGS. 13A, 13B, and 13C depict the light-emitting module pertaining to Variation 3, FIG. 13A being a plan view, FIG. 13B being a right-side view, and FIG. 13C being a front view. The light-emitting module 310 pertaining to Variation 3 depicted in FIGS. 13A, 13B, and 13C has the light sources W1, W2, and R arranged as surface-mounted devices (hereinafter, SMD) on an upper surface 311a of a substrate 311 that is a disc. The light sources W1, W2, and R are shaped as substantially square dots as seen in a plan view from above the substrate 311, each being configured from one light-emitting element 312a, 312b, or 312c and one sealer member 313a, 313b, or 313c. The light sources W1, W2, and R are arranged in a zigzag pattern such that no neighboring pairs are of the same color. Thus, the light produced by the light sources W1, W2, and R is uniform and less prone to discoloration.

(Lighting Device)

The lighting device of the present disclosure is not limited to the lighting device 6 pertaining to the above-described Embodiment.

For example, in the above-described Embodiment, the lighting device of the disclosure is described as a lamp unit adapted to a downlight. However, no such limitation to the form of the lighting device is intended. For example, the lighting device may be adapted to a straight-tube LED lamp or to an LED bulb, which are expected to replace straight-tube fluorescent lamps as described below. The straight-tube LED lamp is an LED lamp that has substantially the same shape as a conventional general straight-tube fluorescent lamp using electrode coils. The LED bulb is an LED lamp that has substantially the same shape as a conventional incandescent bulb.

Figure 14:
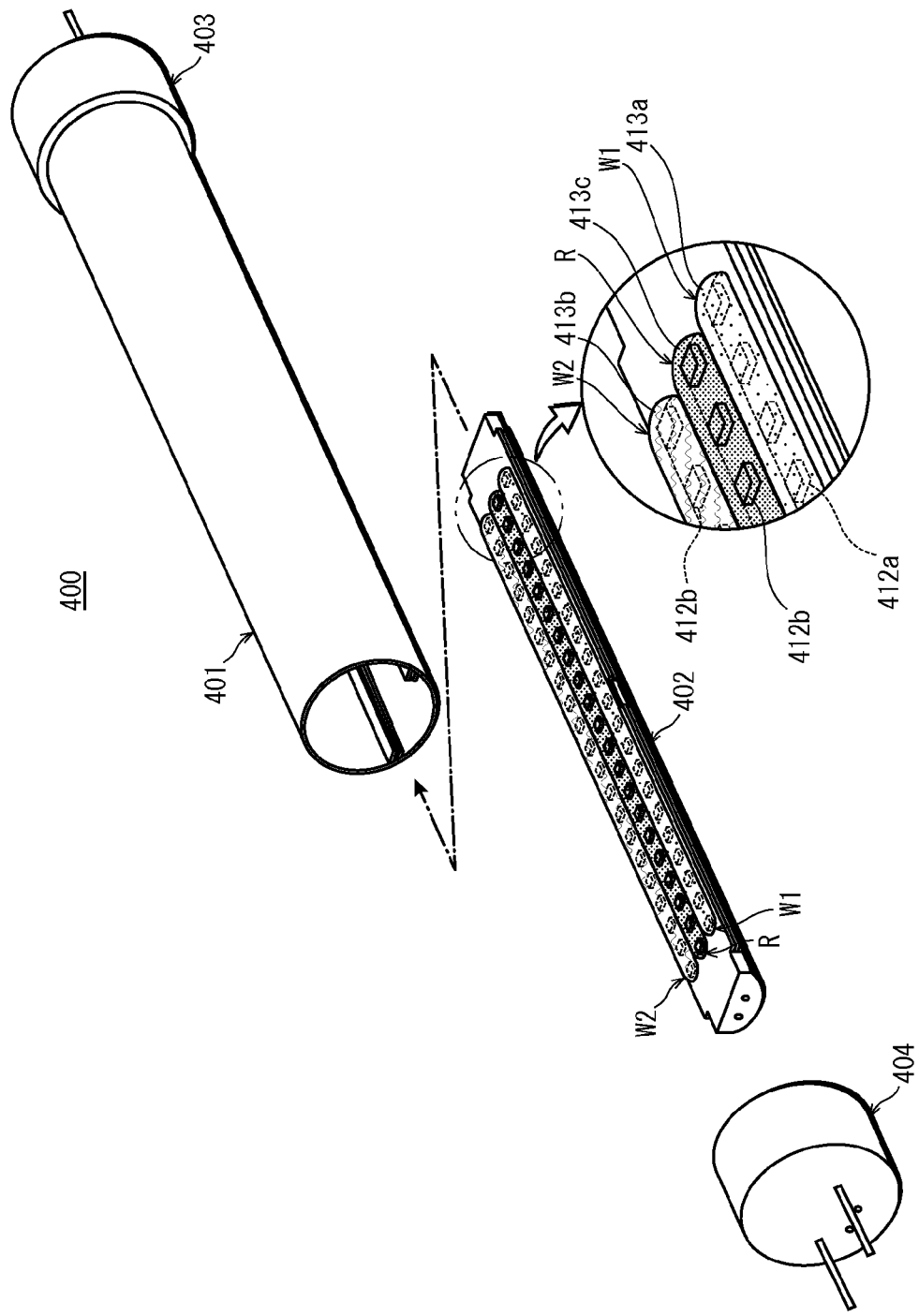
FIG. 14 depicts a lighting device pertaining to Variation 4.

FIG. 14 depicts a lighting device pertaining to Variation 4. As depicted in FIG. 14, a lighting device 400 includes a casing 401 shaped as an elongated tube, a mount 402 arranged within the casing 401, a plurality of light sources W1, W2, and R mounted on the mount 402, and a pair of bases 403 and 404 affixed to the two ends of the casing 401.

The casing 401 has an elongated shape with openings at both ends, and contains the light sources W1, W2, and R as well as the mount 402. No particular limitation in intended to the material of the casing 401. However, a translucent material is beneficial. Examples of the translucent material include a resin such as plastic, or glass, or similar. No particular limitation is intended to the cross-sectional shape of the casing 401, which may be annular or polygonal.

The mount 402 is an elongated plate extending to the vicinity of the bases 403 and 404 at each end. The longitudinal length of the mount 402 is substantial equal to the longitudinal length of the casing 401. The mount 402 beneficially serves as a heat sink dissipating heat from the light sources W1, W2, R, and is thus beneficially formed from a material having high thermal conductivity, such as metal.

The light sources W1, W2, and R are provided one per color, each being elongated along the longitudinal direction of the mount 402 and being arranged in parallel with equal spacing therebetween. The light sources W1, W2, and R are each configured from a plurality of light-emitting elements 412a, 412b, or 413c arranged in a row that is a straight line along the longitudinal direction of the mount 402, and a sealer member 413a, 413b, or 413b that is elongated and seals the light-emitting elements 412a, 413b, or 413c. The light sources W1, W2, and R function identically to the light sources W1, W2, and R of the above-described Embodiment. The lighting device 400 is able to produce illumination light having a stable FCI unaffected by the lighting conditions by performing white light source switching control on the light sources W1, W2, and R similar to that of the above-described Embodiment.

The pair of bases 403 and 404 are affixed to sockets of a (non-diagrammed) lighting equipment. Power is supplied to the power sources W1, W2, and R through the pair of bases 403 and 404 with the lighting device 400 affixed to the lighting equipment. Also, heat generated by the light sources W1, W2, and R is conducted to the lighting equipment via the mount 402 and the pair of bases 403 and 404.

Figure 15:
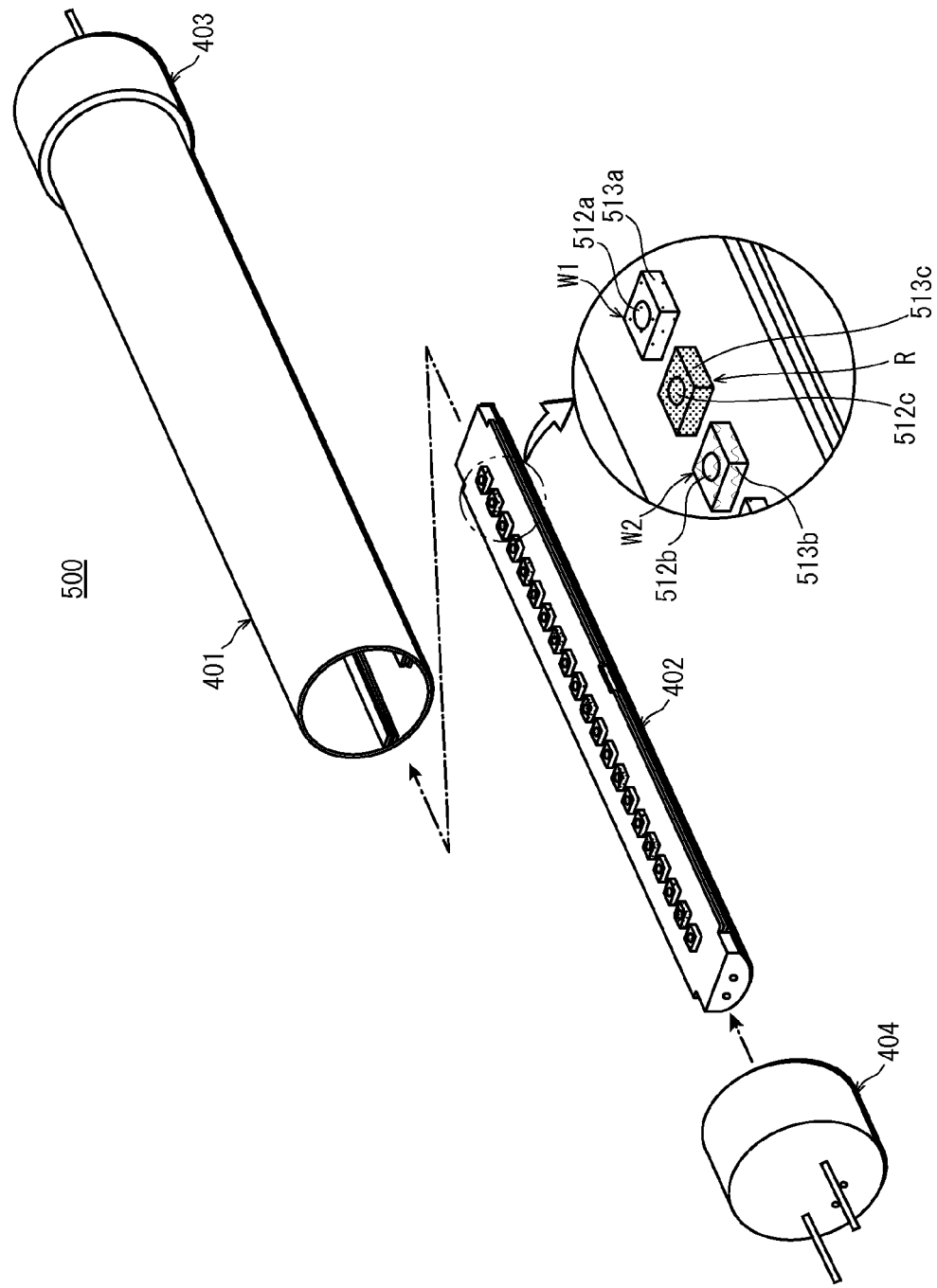
FIG. 15 depicts a lighting device pertaining to Variation 5.

FIG. 15 depicts a lighting device pertaining to Variation 5. As depicted in FIG. 15, a lighting device 500 includes the casing 401, the mount 402, and the pair of bases 403 and 404 similarly to Variation 4, and also has a plurality of the power sources W1, W2, and R mounted on the mount 402.

In the present Variation, the light sources W1, W2, and R are SMDs, each being configured from one light-emitting element 512a, 512b, or 512c and one sealer member 513a, 513b, or 513c. The light sources W1, W2, and R are arranged along the longitudinal direction of the mount 402 in straight lines having equal spacing therebetween such that no neighboring pairs of the light sources W1, W2, and R are of the same color, and with the red light source R being arranged between the first white light source W1 and the second white light source W2. The light sources W1, W2, and R function identically to the light sources W1, W2, and R of the above-described Embodiment. The lighting device 500 is able to produce illumination light having a stable FCI unaffected by the lighting conditions by performing white light source switching control on the light sources W1, W2, and R similar to that of the above-described Embodiment.

Figure 16:
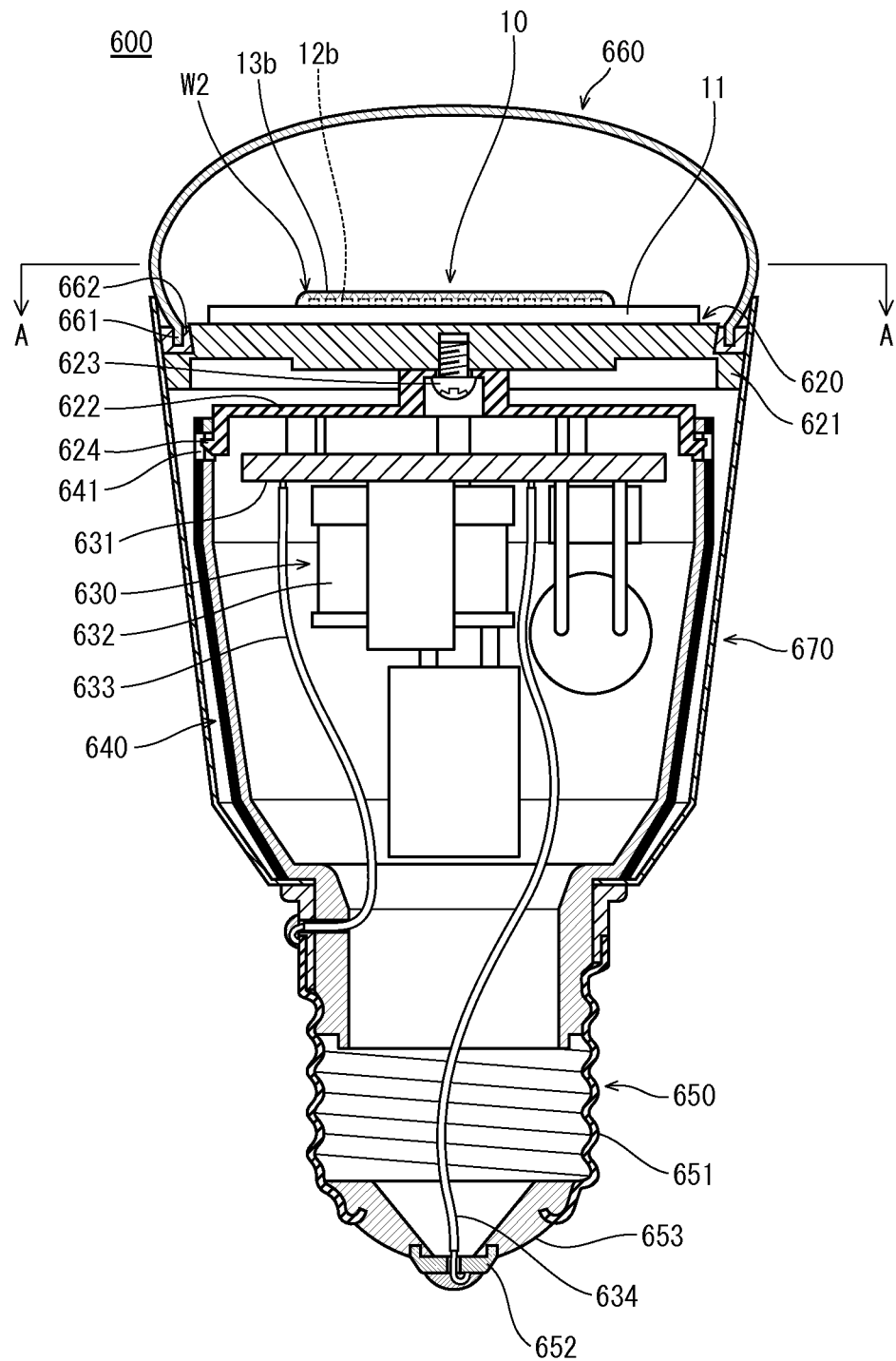
FIG. 16 is a cross-sectional diagram depicting a lighting device pertaining to Variation 6.

FIG. 16 is a cross-sectional diagram depicting a lighting device pertaining to Variation 6. As depicted in FIG. 16, the lighting device 600 pertaining to Variation 6 is an LED bulb that includes a light-emitting module 10, a holder 620, a circuit unit 630, a circuit case 640, a base 650, a globe 660, and a casing 670 as main components.

The light-emitting module 10 is identical to the light-emitting module 10 of the above-described Embodiment, and includes the substrate 11, the light-emitting elements 12a, 12b, and 12c, and the sealer members 13a, 13b, and 13c as depicted in FIGS. 8A, 8B, and 8C. The first white light source W1 is configured from light-emitting element 12a and sealer member 13a, the second white light source W2 is configured from light-emitting element 12b and sealer member 13b, and the red light source R is configured from light-emitting element 12c and sealer member 13c.

The holder 620 includes a module holder 620 and a circuit holder 622. The module holder 621 is a substantially discoid member for affixing the light-emitting module 10 to the casing 670, is formed from aluminum or a similar material having good thermal conductivity, and also serves as a thermal conduction member conducting heat from the light-emitting module 10 to the casing 670. The circuit holder 622 is a substantially circular plate made of synthetic resin, for example, and is fixed to the module holder 621 by a screw 623. An engaging claw 624 for engaging with a the circuit case 640 is provided at the periphery of the circuit holder 622.

The circuit unit 630 includes a circuit substrate 631 and a plurality of electronic components 632 mounted on the circuit substrate 631, is contained within the casing 670 with the circuit substrate 631 fixed to the circuit holder 622, and is electrically connected to the light-emitting module 10.

The circuit unit 630 corresponds to the circuit unit 4 of the above-described Embodiment, in which the lighting circuit 4c, the dimming ratio detection circuit 4d, the current detector 4e, and the control circuit 4 are unified as a lighting circuit. The lighting device 600 is able to produce illumination light having a stable FCI unaffected by the lighting conditions by having the circuit unit 630 perform white light source switching control on the light sources W1, W2, and R similar to that of the above-described Embodiment.

The circuit case 640 is affixed to the circuit holder 622 with the circuit unit 630 contained therein. An engaging hole 641 that engages with the engaging claw 624 of the circuit holder 622 is provided on the circuit case 640. The circuit case 640 is affixed to the circuit holder 622 by the engagement of the engaging claw 624 with the engaging hole 624.

The base 650 is a base defined by Japanese Industrial Standards (hereinafter, JIS), such as an Edison screw conforming to the standard, and is used for mounting into a typical incandescent bulb socket (not diagrammed). The base 650 includes a shell 651, also termed a cylindrical barrel, and an eyelet 652 shaped as a circular plate. The base 650 is affixed to the circuit case 640. The shell 651 and the eyelet 652 are integrated as one, with an insulator 653 made of a glass material being interposed therebetween. The shell 651 is electrically connected to a feed line 633 of the circuit unit 630, and the eyelet 652 is electrically connected to another feed line 634 of the circuit unit 630.

The globe 660 is substantially dome-shaped, covers the light-emitting module 10, and has an opening end 661 fixed to the casing 670 and to the module holder 621 by an adhesive 662.

The casing 670 is, for example, cylindrical, having the light-emitting module 10 disposed at one opening end thereof and the base 650 disposed at another opening end thereof. The casing 670 is formed from a base material having good thermal conductivity, such as aluminum, in order to serve as a dissipation member (i.e., a heat sink) dissipating heat from the light-emitting module 10.

(Lighting Equipment)

The lighting equipment of the present disclosure is not limited to the lighting equipment 1 pertaining to the above-described Embodiment.

For example, in the above-described Embodiment, the light-emitting module is embedded in the lighting equipment as a part of a lighting device. However, the light-emitting module may also be directly embedded in the lighting equipment, not as part of a lighting device but as a single device itself.

(Lighting Circuit)

In the above-described Embodiment, the entire lighting circuit, including the lighting circuit 4c, the dimming ratio detection circuit 4d, the current detector 4e, and the control circuit 4f, is provided outside the lighting device 6 as the circuit unit 4. However, the lighting circuit may also be provided in whole or in part within the lighting device as a portion of the lighting device. That is, the lighting circuit, the dimming ratio detection circuit, the current detector, and the control circuit may all be incorporated in the lighting device, or a subset of one to three of these four components may be incorporated into the lighting device. Also, the lighting circuit may be wholly or partly configured as a portion of the light-emitting module, for example by being built onto the substrate of the light-emitting module. That is, the lighting circuit, the dimming ratio detection circuit, the current detector, and the control circuit may all be part of the light-emitting module, or a subset of one to three of these four components may be part of the light-emitting module.

(Other)

The configuration of the present disclosure has been described above in accordance with the Embodiment and Variations. However, no limitation to the above-described Embodiment and Variations is intended. For example, a configuration partially combining the above-described Embodiment and Variations may be configured as appropriate. In addition, that the materials, the numerical values, and so on given in the above Embodiment above are merely preferred values. No limitation is intended thereby. Furthermore, the configuration of the present disclosure may be modified as needed, within the scope of the technical intent. The present disclosure is widely applicable to general lighting application.

REFERENCE SIGNS LIST

1 Lighting equipment
6, 400, 500, 600 Lighting device
4, 640 Lighting circuit (Circuit unit)
10, 110, 210, 310 Light-emitting module
12a, 112a, 212a, 312a, 412a, 512a First light-emitting element
12b, 112b, 212b, 312b, 412b, 512b Second light-emitting element
12c, 112c, 212c, 312c, 412c, 512c Red light-emitting element (Third light-emitting element)
13a, 113a, 213a, 313a, 413a, 513a First wavelength converter member (First sealer member)
13b, 113b, 213b, 313b, 413b, 513b Second wavelength converter member (Second sealer member)
W1 First white light source
W2 Second white light source
R Red light source

The invention claimed is:

1. Lighting equipment, comprising
 a first white light source including a first light-emitting element and a first wavelength converter member performing wavelength conversion on a portion of light from the first light-emitting element, the first white light source producing first white light by combining light from the first light-emitting element that is converted by the first wavelength converter member and light from the first light-emitting element that is not converted by the first wavelength converter member;
 a second white light source including a second light-emitting element and a second wavelength converter member performing wavelength conversion on a portion of light from the second light-emitting element, the second white light source producing second white light by combining light from the second light-emitting element that is converted by the second wavelength converter member and light from the second light-emitting element that is not converted by the second wavelength converter member, the light from the second light-emitting element that is converted by the second wavelength converter member differing spectrally from the light from the first light-emitting element that is converted by the first wavelength converter member in terms of at least one of peak wavelength and full width at half maximum;
 a red light source including a red light-emitting element and producing red light; and
 a control circuit performing control of lighting the first light-emitting element while substantially not lighting the second light-emitting element when the red light-emitting element is lit under first lighting conditions where a peak wavelength of light from the red light-emitting element has a first value, and of lighting the second light-emitting element while substantially not lighting the first light-emitting element when the red light-emitting element is lit under second lighting conditions where the peak wavelength of the light from the red light-emitting element has a second value, the second value being greater than the first value.

2. The lighting equipment of claim 1, wherein
 the first wavelength converter member converts the light from the first light-emitting element into light having a peak wavelength of no less than 535 nm and no more than 555 nm and a full width at half maximum of no less than 50 nm and no more than 70 nm, and
 the second wavelength converter member converts the light from the second light-emitting element into light having a peak wavelength of no less than 540 nm and no more than 580 nm and a full width at half maximum of no less than 100 nm and no more than 130 nm.

3. The lighting equipment of claim 1, wherein
 the light from the first light-emitting element and the light from the second light-emitting element each have a peak wavelength of no less than 450 nm and no more than 470 nm.

4. The lighting equipment of claim 1, wherein
 the light from the red light-emitting element has a peak wavelength of no less than 620 nm and no more than 626 nm under the first lighting conditions.

5. The lighting equipment of claim 1, wherein
 the light from the red light-emitting element has a peak wavelength of no less than 623 nm and no more than 630 nm under the second lighting conditions.

6. The lighting equipment of claim 1, wherein,
 under the first lighting conditions, the red light-emitting element is lit at a first temperature and with a first current, and
 under the second lighting conditions, the red light-emitting element is lit at a second temperature that is higher than the first temperature and/or with a second current that is greater than the first current.

7. The lighting equipment of claim 1, wherein
 under the first lighting conditions, the red light-emitting element is lit at a first temperature, and
 under the second lighting conditions, the red light-emitting element is lit at a second temperature that is higher than the first temperature.

8. The lighting equipment of claim 1, wherein
 under the first lighting conditions, the red light-emitting element is lit with a first current, and
 under the second lighting conditions, the red light-emitting element is lit with a second current that is greater than the first current.

9. A lighting device, comprising
 a first white light source including a first light-emitting element and a first wavelength converter member performing wavelength conversion on a portion of light from the first light-emitting element, the first white light source producing first white light by combining light from the first light-emitting element that is converted by the first wavelength converter member and light from the first light-emitting element that is not converted by the first wavelength converter member;
 a second white light source including a second light-emitting element and a second wavelength converter member performing wavelength conversion on a portion of light from the second light-emitting element, the second white light source producing second white light by combining light from the second light-emitting element that is converted by the second wavelength converter member and light from the second light-emitting element that is not converted by the second wavelength converter member, the light from the second light-emitting element that is converted by the second wavelength converter member differing spectrally from the light from the first light-emitting element that is converted by the first wavelength converter member in terms of at least one of peak wavelength and full width at half maximum;

a red light source including a red light-emitting element and producing red light; and a control circuit performing control of lighting the first light-emitting element while substantially not lighting the second light-emitting element when the red light-emitting element is lit under first lighting conditions where a peak wavelength of light from the red light-emitting element has a first value, and of lighting the second light-emitting element while substantially not lighting the first light-emitting element when the red light-emitting element is lit under second lighting conditions where the peak wavelength of the light from the red light-emitting element has a second value, the second value being greater than the first value.

10. A light-emitting module, comprising a first white light source including a first light-emitting element and a first wavelength converter member performing wavelength conversion on a portion of light from the first light-emitting element, the first white light source producing first white light by combining light from the first light-emitting element that is converted by the first wavelength converter member and light from the first light-emitting element that is not converted by the first wavelength converter member;

a second white light source including a second light-emitting element and a second wavelength converter member performing wavelength conversion on a portion of light from the second light-emitting element, the second white light source producing second white light by combining light from the second light-emitting element that is converted by the second wavelength converter member and light from the second light-emitting element that is not converted by the second wavelength converter member, the light from the second light-emitting element that is converted by the second wavelength converter member differing spectrally from the light from the first light-emitting element that is converted by the first wavelength converter member in terms of at least one of peak wavelength and full width at half maximum;

a red light source including a red light-emitting element and producing red light; and a control circuit performing control of lighting the first light-emitting element while substantially not lighting the second light-emitting element when the red light-emitting element is lit under first lighting conditions where a peak wavelength of light from the red light-emitting element has a first value, and of lighting the second light-emitting element while substantially not lighting the first light-emitting element when the red light-emitting element is lit under second lighting conditions where the peak wavelength of the light from the red light-emitting element has a second value, the second value being greater than the first value.

\* \* \* \* \*